United States Patent
Yamashita et al.

(10) Patent No.: US 9,805,905 B2
(45) Date of Patent: Oct. 31, 2017

(54) BLANKING DEVICE FOR MULTI-BEAM OF CHARGED PARTICLE WRITING APPARATUS USING MULTI-BEAM OF CHARGED PARTICLE AND DEFECTIVE BEAM BLOCKING METHOD FOR MULTI-BEAM OF CHARGED PARTICLE

(71) Applicant: NuFlare Technology, Inc., Yokohama (JP)

(72) Inventors: Hiroshi Yamashita, Sagamihara (JP); Ryoichi Yoshikawa, Kawasaki (JP); Kazuhiro Chiba, Sagamihara (JP); Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/838,907

(22) Filed: Aug. 28, 2015

(65) Prior Publication Data

US 2016/0064179 A1    Mar. 3, 2016

(30) Foreign Application Priority Data

Sep. 3, 2014 (JP) ................................. 2014-179659

(51) Int. Cl.
*H01J 37/04* (2006.01)
(52) U.S. Cl.
CPC ....... *H01J 37/045* (2013.01); *H01J 2237/043* (2013.01); *H01J 2237/3175* (2013.01)
(58) Field of Classification Search
CPC ................. H01J 37/045; H01J 37/3177; H01J 2237/043; H01J 2237/31715
See application file for complete search history.

(56) References Cited

U.S. PATENT DOCUMENTS 4,063,091 A * 12/1977 Gee ........................ H01J 37/045
                                                                     250/309
4,434,371 A * 2/1984 Knauer .................. G21K 1/087
                                                                   250/396 R (Continued)

FOREIGN PATENT DOCUMENTS

JP          2013-128031              6/2013
JP      2013128031  A *  6/2013

OTHER PUBLICATIONS

Office Action dated Aug. 9, 2016, in Korean Patent Application No. 10-2015-0123575, w/English-language Translation.

(Continued)

*Primary Examiner* — Wyatt Stoffa
(74) *Attorney, Agent, or Firm* — Oblon, McClelland, Maier & Neustadt, L.L.P.

(57) ABSTRACT

A blanking device for multi-beams includes arrayed plural separate blanking systems, each performing blanking control switching a corresponding beam of multi charged particle beams between a beam ON state and a beam OFF state and each including a first electrode, a first potential applying mechanism applying two different potentials selectively to the first electrode for the blanking control, and a second electrode performing blanking deflection of the corresponding beam, the second electrode being grounded and paired with the first electrode, and a potential change mechanism changing a potential of the second electrode from a ground potential to another potential, wherein when a potential of the first electrode included in one of the separate blanking systems is fixed to the ground potential, the potential change mechanism changes the potential of the second electrode corresponding to the first electrode fixed to the ground potential, from the ground potential to the another potential.

10 Claims, 28 Drawing Sheets

(56) References Cited

U.S. PATENT DOCUMENTS

| | | | | |
|---|---|---|---|---|
| 4,607,333 A | * | 8/1986 | Yasutake | H01J 37/1477 250/398 |
| 4,710,640 A | * | 12/1987 | Kawasaki | B82Y 10/00 219/121.25 |
| 9,123,500 B2 | * | 9/2015 | Miller | H01J 37/08 |
| 2007/0075256 A1 | * | 4/2007 | Buller | B82Y 10/00 250/396 R |
| 2008/0283778 A1 | * | 11/2008 | Tomimatsu | H01J 37/045 250/492.21 |
| 2012/0015303 A1 | * | 1/2012 | Hirata | H01J 37/045 430/296 |
| 2012/0091358 A1 | * | 4/2012 | Wieland | H01J 37/1471 250/396 R |
| 2012/0145916 A1 | * | 6/2012 | Wieland | H01J 37/1471 250/396 R |
| 2012/0261586 A1 | * | 10/2012 | Knippels | H01J 37/045 250/396 R |
| 2012/0292491 A1 | * | 11/2012 | Wieland | B82Y 10/00 250/215 |
| 2013/0082187 A1 | * | 4/2013 | Ogasawara | H01J 37/3007 250/396 ML |
| 2013/0252145 A1 | * | 9/2013 | Matsumoto | H01J 37/3007 430/30 |
| 2013/0256553 A1 | * | 10/2013 | Miller | H01J 37/08 250/396 R |
| 2014/0014852 A1 | * | 1/2014 | Wieland | B82Y 10/00 250/396 R |
| 2014/0162191 A1 | * | 6/2014 | Ito | H01J 37/3026 430/296 |
| 2016/0061876 A1 | * | 3/2016 | Yamashita | H01J 37/045 324/511 |

OTHER PUBLICATIONS

Office Action dated Feb. 27, 2017, in Korean Patent Application No. 10-2015-0123575, (with English-language Translation).

Koren Office Action dated Apr. 27, 2017 in Korean Application No. 10-2015-0123575 with English translation, 7 pages.

* cited by examiner

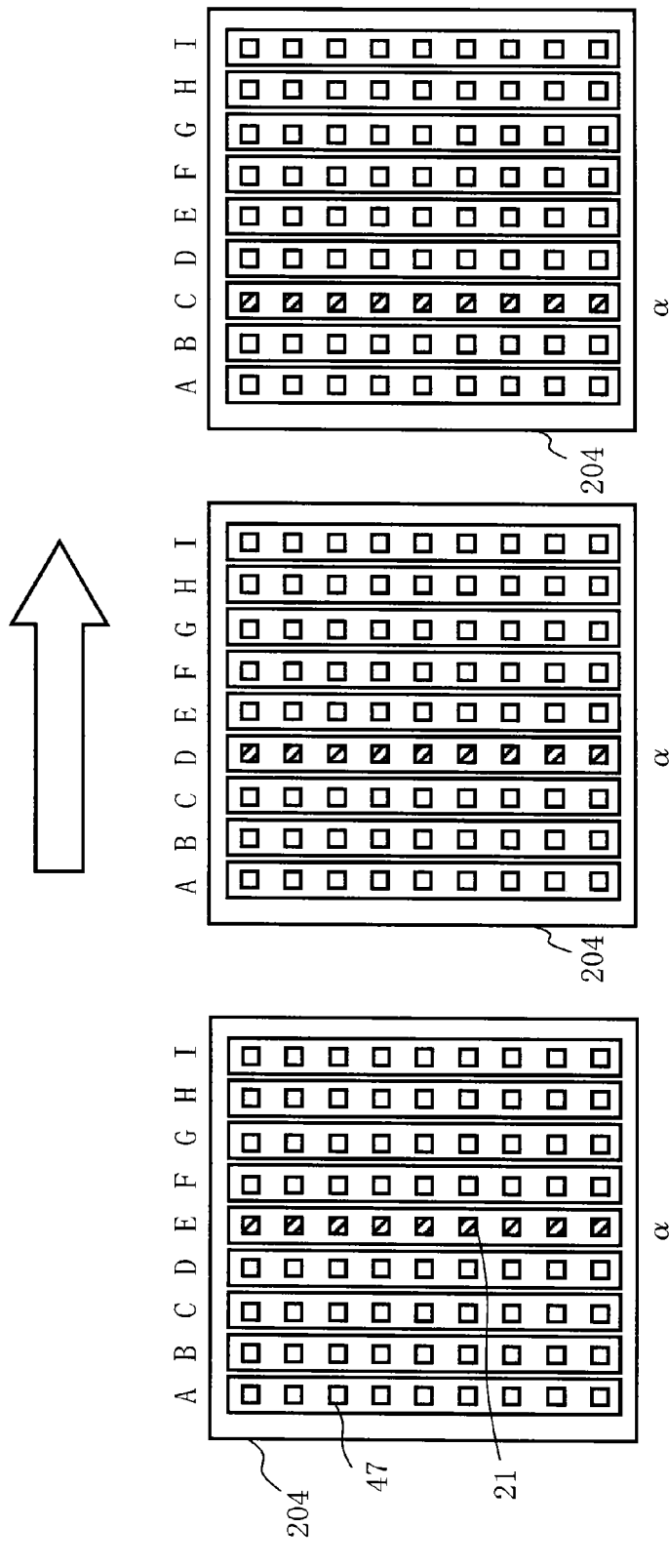

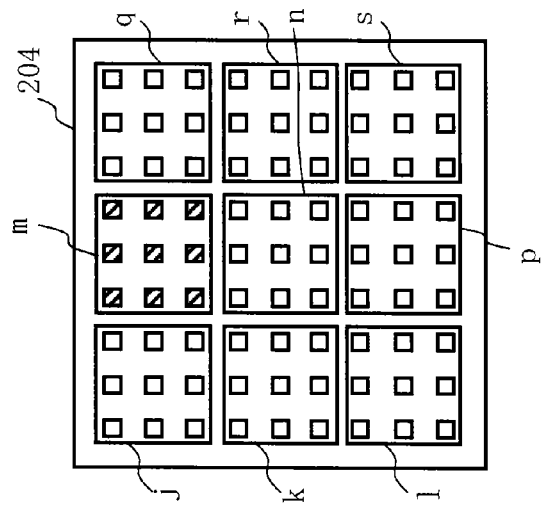
FIG. 14C
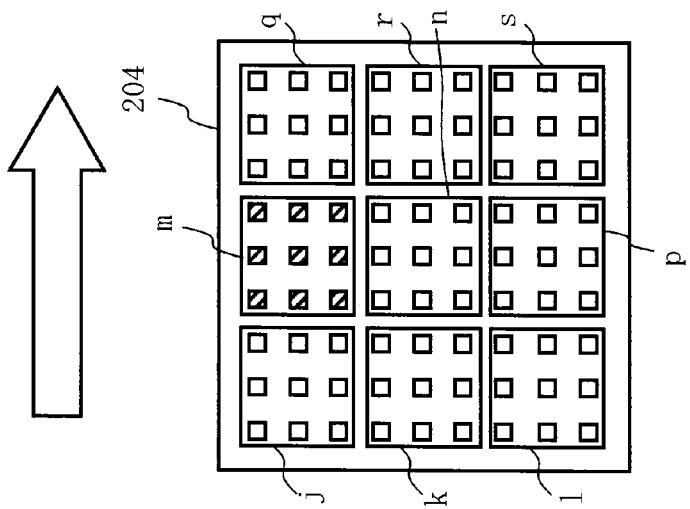
FIG. 14B
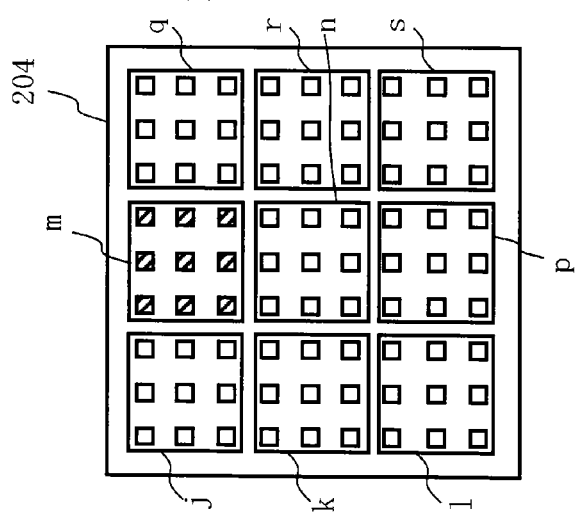
FIG. 14A
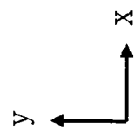

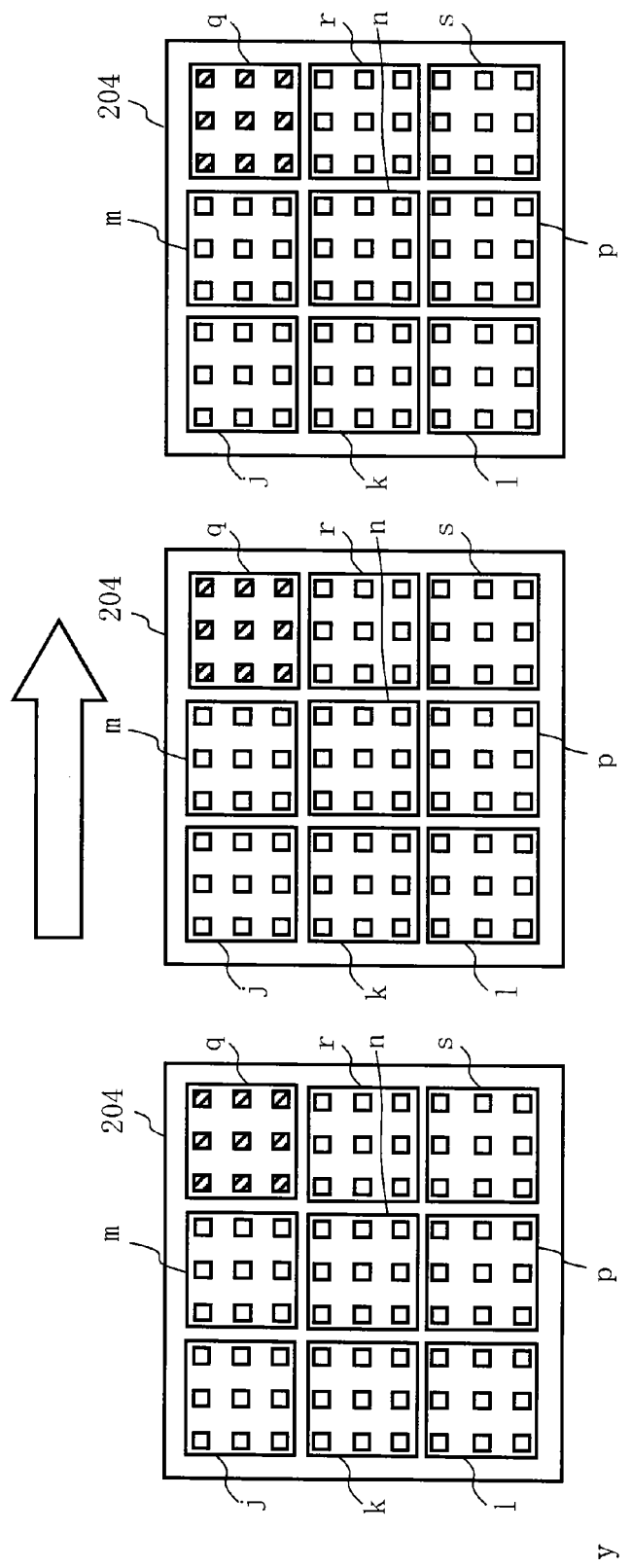

BLANKING DEVICE FOR MULTI-BEAM OF CHARGED PARTICLE WRITING APPARATUS USING MULTI-BEAM OF CHARGED PARTICLE AND DEFECTIVE BEAM BLOCKING METHOD FOR MULTI-BEAM OF CHARGED PARTICLE

CROSS-REFERENCE TO RELATED APPLICATION

This application is based upon and claims the benefit of priority from the prior Japanese Patent Application No. 2014-179659 filed on Sep. 3, 2014 in Japan, the entire contents of which are incorporated herein by reference.

BACKGROUND OF THE INVENTION

Field of the Invention

Embodiments of the present invention relate generally to a blanking device for multi charged particle beams, a multi charged particle beam writing apparatus, and a method for blocking defective beams of multi charged particle beams, and more specifically, to a blanking device used in multi-beam writing and a method for blocking defective beams by using the blanking device, for example.

Description of Related Art

The lithography technology that advances miniaturization of semiconductor devices is extremely important as a unique process whereby patterns are generated in semiconductor manufacturing. In recent years, with high integration of LSI, the linewidth (critical dimension) required for semiconductor device circuits is decreasing year by year. The electron beam writing technique, which intrinsically has excellent resolution, is used for writing or "drawing" a mask pattern on a mask blank with electron beams.

As an example employing the electron beam writing technique, a writing apparatus using multiple beams (multi-beams) can be cited. Compared with the case of writing a pattern by using a single electron beam, since it is possible to emit multiple beams at a time (one shot) in multi-beam writing, the throughput can be greatly increased. For example, in a writing apparatus employing a multi-beam system, multi-beams are formed by letting portions of an electron beam emitted from an electron gun assembly pass through a corresponding hole of a plurality of holes in the mask, blanking control is provided for each of the beams, and each unblocked beam is diminished by an optical system to reduce a mask image, and deflected by a deflector so as to irradiate a desired position on a target object or "sample".

In multi-beam writing, the dose of each beam is separately controlled based on an irradiation time. For highly accurately controlling such a dose of each beam, it is necessary to perform high speed blanking control to provide an ON or OFF state of each beam. In a writing apparatus of a multi-beam system, a blanking control circuit for each beam is placed on a blanking plate where blankers each for each of multi-beams are arranged.

Here, each blanker for the multi-beams is configured by a pair of counter electrodes, and specifically, a voltage for blanking control is applied to a control electrode and the other counter electrode is grounded. In blanking control, a beam OFF state is generated for the grounded counter electrode by applying a positive potential to the control electrode in order to deflect a beam toward the control electrode so as not to let the beam pass through a limiting aperture of the blanking aperture member. For example, when multi-beams are composed of n×n beams, n×n pairs of electrodes and their control circuits are arrayed in the blanking device. For example, with respect to a blanking device in which 512×512 pairs of electrodes and their control circuits are arrayed, it is reported that the fraction defective of the structure that is configured by the 512×512 pairs of electrodes and their control circuits is about 0.04%. As one of defects, there is a case in which the potential of the control electrode is fixed to a ground potential by some malfunction. In such a case, since the electric potential of the counter electrode is a ground potential, no electric field is generated between the electrodes, thereby not deflecting beams. Accordingly, beams are not controlled to be beam OFF. Then, such uncontrolled beams being fixed to beam ON pass through a limiting aperture. There arises a problem that writing defect occurs because such unwanted beams irradiate the target object. Such configuration defects caused by pairs of electrodes and their control circuits may be produced at the stage of fabrication or produced with a high probability by a failure during use after mounting them in the writing apparatus. It is conventionally difficult to check the beam control state before actually placing them in the writing apparatus and emitting each beam of the multi-beams. Although defects produced at the stage of fabrication can be detected by inspection after the fabrication, if a defect being fixed to beam ON occurs during used for writing processing, the blanking device comes to be unusable thereafter.

Conventionally, a method is examined in which, before beams including such a defective beam being fixed to beam ON irradiate the target object, a movable block member is transferred to be directly underneath the beams in order to compulsorily perform blocking (e.g., refer to Japanese Patent Application Laid-open (JP-A) No. 2013-128031).

BRIEF SUMMARY OF THE INVENTION

According to one aspect of the present invention, a blanking device for multi charged particle beams includes a plurality of separate blanking systems which are arrayed and each of which is configured to provide blanking control that switch a corresponding beam of multi charged particle beams between a beam ON state and a beam OFF state, the each of the plurality of separate blanking systems including, a first electrode, a first potential applying mechanism configured to apply two different potentials selectively to the first electrode for the blanking control, and a second electrode configured to perform blanking deflection of the corresponding beam, the second electrode being grounded and paired with the first electrode; and a potential change mechanism configured to change a potential of the second electrode from a ground potential to another potential, wherein when a potential of the first electrode included in one of the plurality of separate blanking systems is fixed to the ground potential, the potential change mechanism changes the potential of the second electrode corresponding to the first electrode fixed to the ground potential, from the ground potential to the another potential.

According to another aspect of the present invention, a multi charged particle beam writing apparatus includes, a stage configured to mount a target object thereon and to be continuously movable, an emission unit configured to emit a charged particle beam, an aperture member, in which a plurality of openings are formed, configured to form multi-beams by making a region including a whole of the plurality of openings irradiated by the charged particle beam and letting portions of the charged particle beam respectively pass through a corresponding opening of the plurality of openings, the blanking device for multi charged particle beams configured to respectively perform blanking deflection for a corresponding beam of the multi-beams having passed through the plurality of openings of the aperture member, and a blanking aperture member configured to block each beam of the multi-beams which has been deflected to be in an OFF state by the blanking device.

Further, according to another aspect of the present invention, a method for blocking defective beams of multi charged particle beams includes selectively applying two different potentials, for blanking control, for switching a corresponding beam of multi charged particle beams between a beam ON state and a beam OFF state, to a first electrode, changing a potential of a second electrode, which is grounded and paired with the first electrode in order to perform blanking deflection of a corresponding beam, to another potential from a ground potential when a potential of the first electrode is fixed to the ground potential, and blocking the corresponding beam, which has been deflected by the second electrode, by a blanking aperture member.

BRIEF DESCRIPTION OF THE DRAWINGS

FIGS. 13A to 13C illustrate another example of multiple exposure according to the first embodiment;

FIGS. 14A to 14C illustrate another example of multiple exposure according to the first embodiment;

FIGS. 15A to 15C illustrate another example of multiple exposure according to the first embodiment;

DETAILED DESCRIPTION OF THE INVENTION

In the following embodiments, there will be described a blanking device that can perform control not to form a defective beam in multi-beams which is fixed to beam ON thereby resulting in uncontrollable blanking, a method for blocking, and a writing apparatus employing the blanking device.

In the following embodiments, there will be described a configuration in which an electron beam is used as an example of a charged particle beam. The charged particle beam is not limited to the electron beam, and other charged particle beam such as an ion beam may also be used.

First Embodiment

Figure 1:
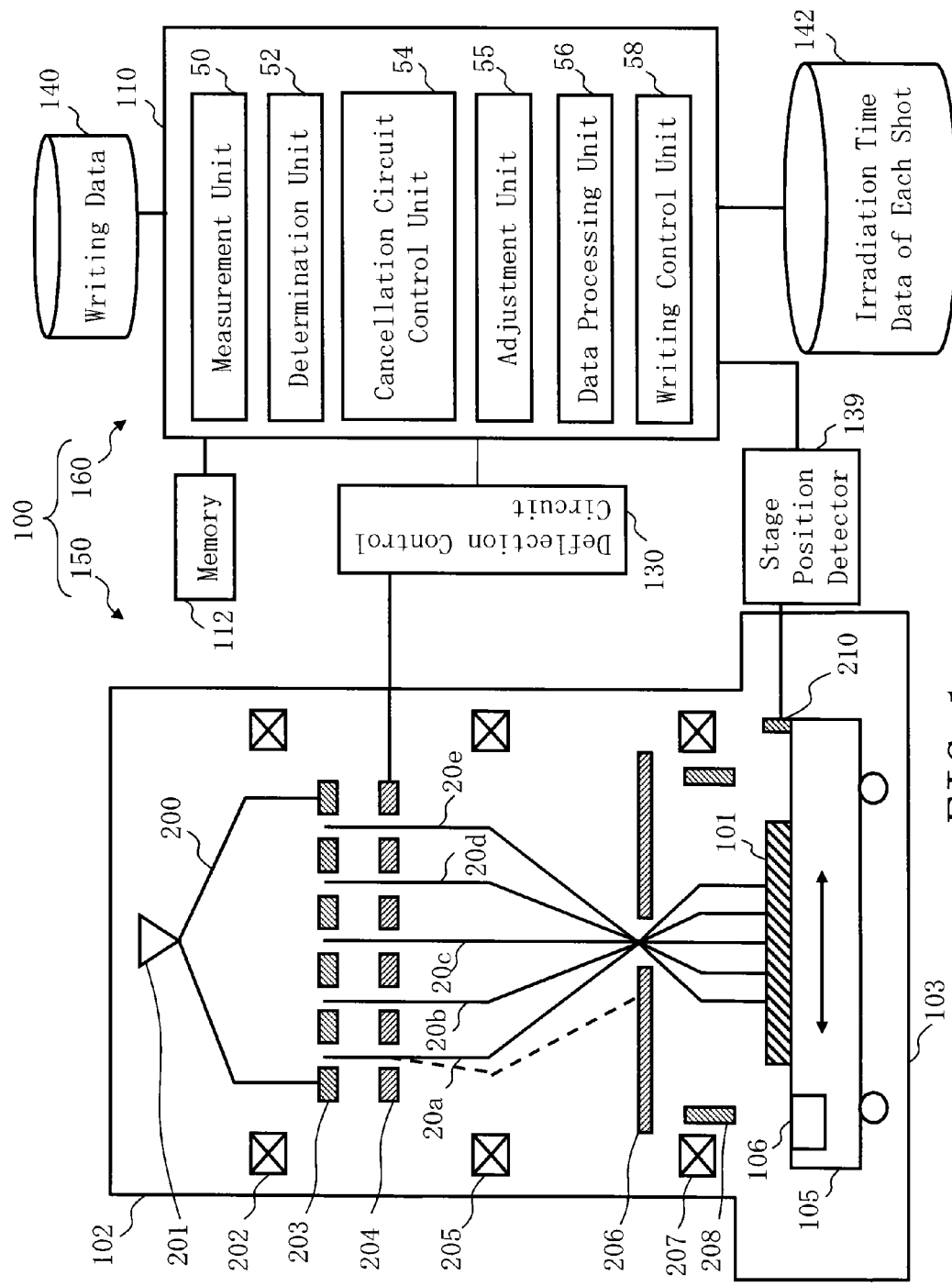
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, an XY stage 105 is arranged. On the XY stage 105, there are placed a Faraday cup 106 and a target object or "sample" 101 such as a mask blank serving as a writing target substrate when writing is performed. For example, the target object 101 is an exposure mask used for manufacturing semiconductor devices, or is a semiconductor substrate (silicon wafer) on which semiconductor elements are formed. A mirror 210 for measuring the position of the XY stage 105 is arranged on the XY stage 105.

The control unit 160 includes a control computer 110, a memory 112, a deflection control circuit 130, a stage position detector 139, and storage devices 140, and 142 such as magnetic disk drives. The control computer 110, the memory 112, the deflection control circuit 130, the stage position detector 139, and the storage devices 140 and 142 are mutually connected through a bus (not shown). Writing data is input from the outside to the storage device 140 (storage unit) to be stored therein.

In the control computer 110, there are arranged a measurement unit 50, a determination unit 52, a cancellation circuit control unit 54, an adjustment unit 55, a data processing unit 56, and a writing control unit 58. Each function, such as the measurement unit 50, determination unit 52, cancellation circuit control unit 54, adjustment unit 55, data processing unit 56, and writing control unit 58 may be configured by hardware such as an electric circuit, or by software such as a program that causes a computer to implement these functions. Alternatively, it may be configured by a combination of hardware and software. Data which is input and output to/from the measurement unit 50, determination unit 52, cancellation circuit control unit 54, adjustment unit 55, data processing unit 56, and writing control unit 58, and data being operated are stored in the memory 112 each time.

FIG. 1 shows a configuration necessary for explaining the first embodiment. Other configuration elements generally necessary for the writing apparatus 100 may also be included.

Figure 2A:
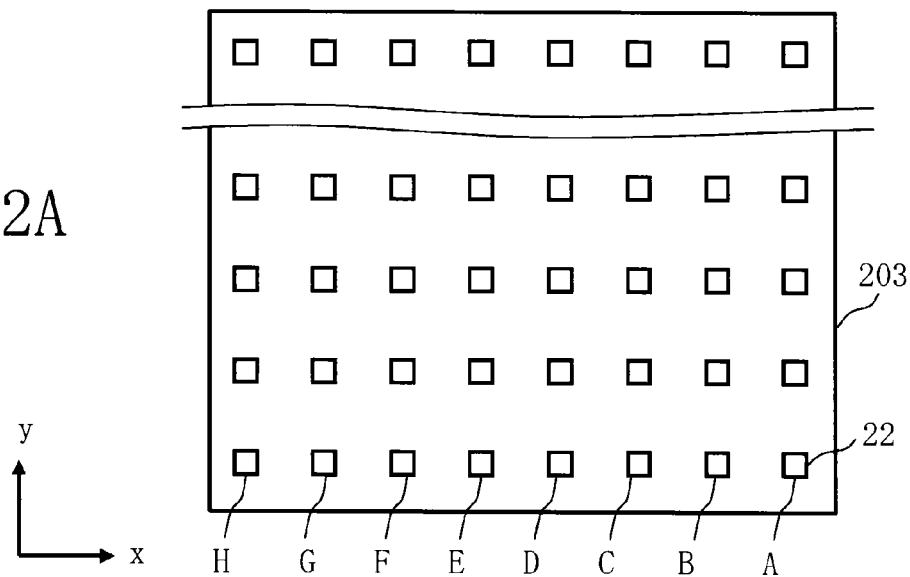
FIGS. 2A and 2B are conceptual diagrams each showing an example of the configuration of an aperture member according to the first embodiment.
Figure 2B:
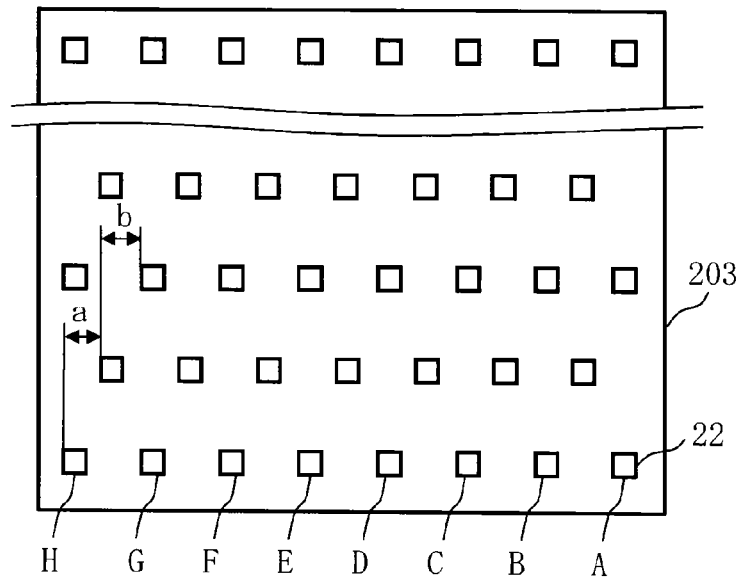

FIGS. 2A and 2B are conceptual diagrams each showing an example of the configuration of an aperture member according to the first embodiment. As shown in FIG. 2A, holes (openings) 22 of m rows long (y direction) and n columns wide (x direction) (m≥2, n≥2) are formed, like a matrix, in the aperture member 203 at a predetermined arrangement pitch. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows that are arrayed in the y direction has eight holes 22 from A to H in the x direction. Multi-beams 20 are formed by letting portions of an electron beam 200 respectively pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
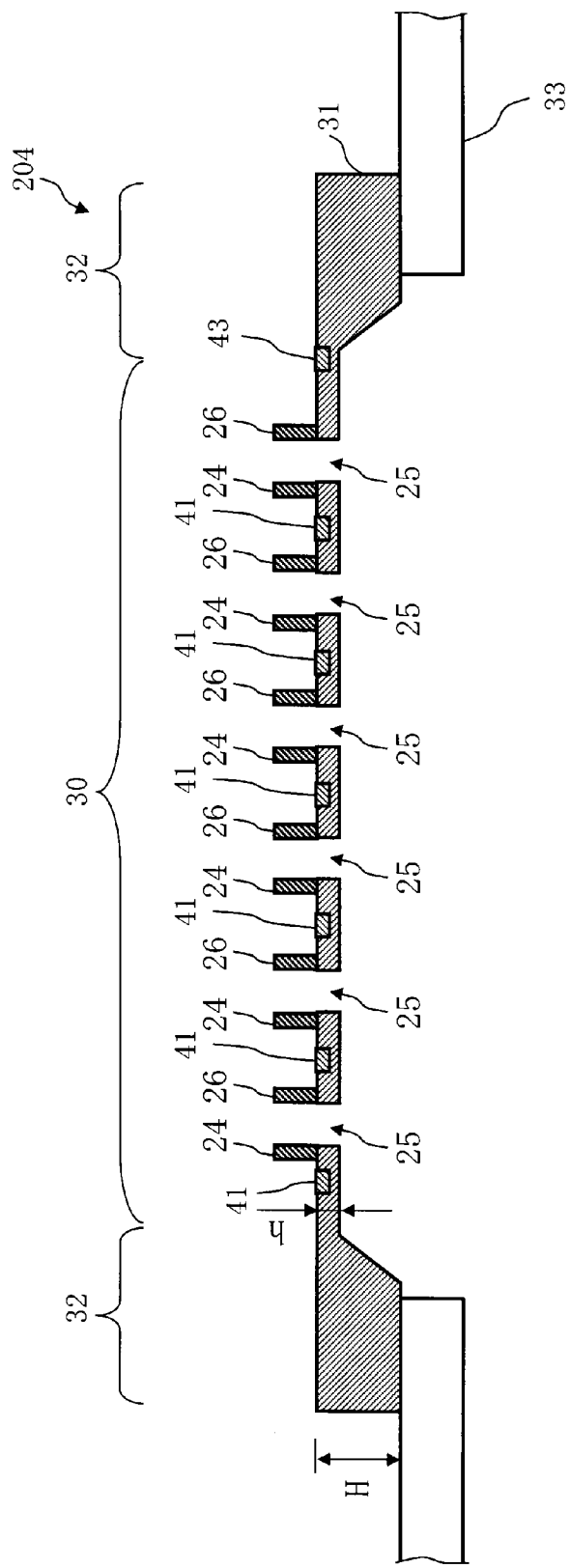
FIG. 3 is a sectional view showing the configuration of a blanking plate according to the first embodiment.
Figure 4:
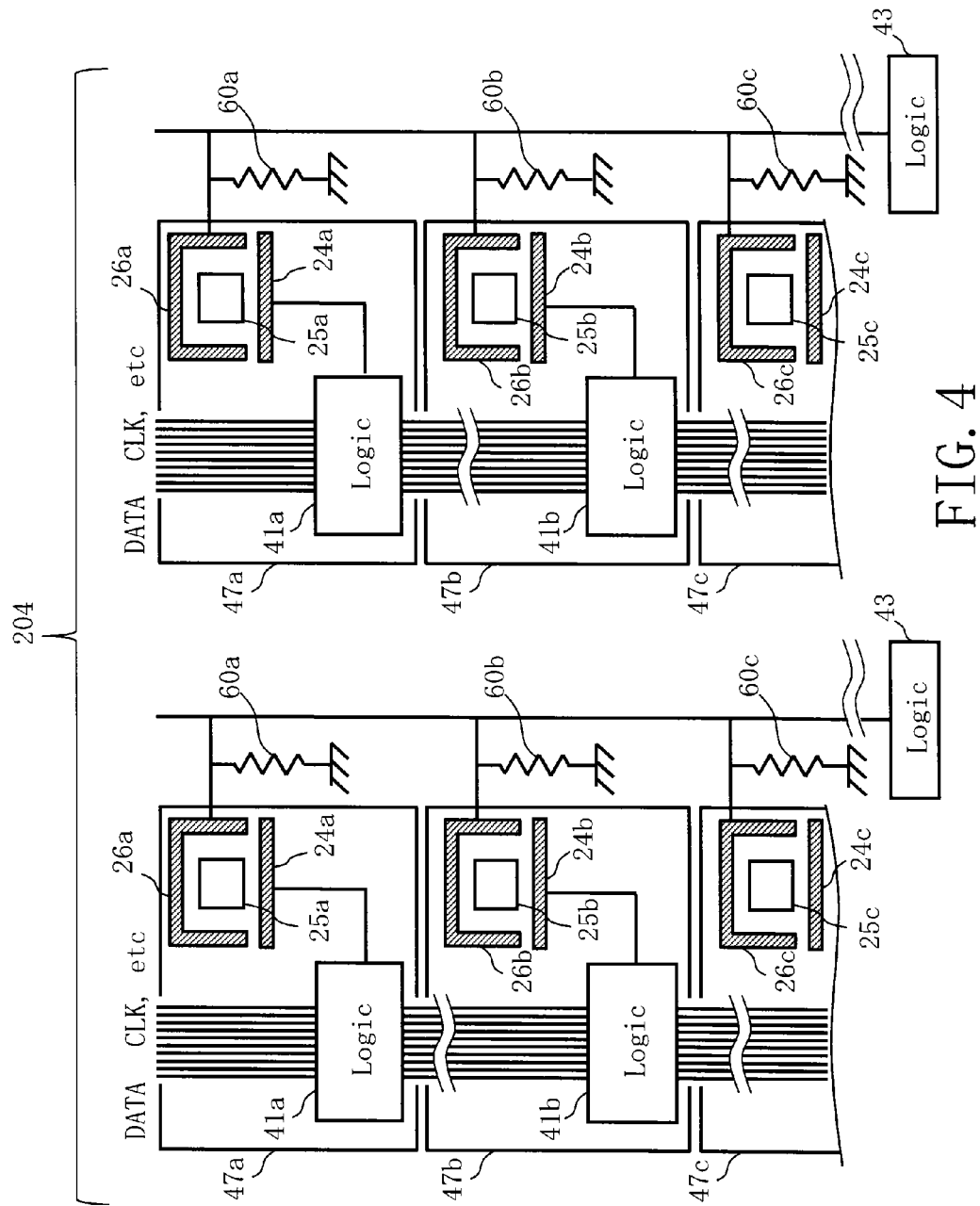
FIG. 4 is a top view conceptual diagram showing a part of the configuration in a membrane region of a blanking plate according to the first embodiment.

FIG. 3 is a sectional view showing the configuration of a blanking plate according to the first embodiment. FIG. 4 is a top view conceptual diagram showing a part of the configuration in a membrane region of a blanking plate according to the first embodiment. In FIGS. 3 and 4, the positional relation of a control electrode 24 and a counter electrode 26 and the positional relation of control circuits 41 and 43 are not in accordance with each other. With regard to the configuration of the blanking plate 204, as shown in FIG. 3, a semiconductor substrate 31 made of silicon, etc. is placed on a support table 33. The central part of the substrate 31 is scraped from the back side, for example, and processed to be a membrane region 30 (first region) whose thin film thickness is h. The circumference surrounding the membrane region 30 is a circumference region 32 (second region) whose thick film thickness is H. The upper surface of the membrane region 30 and the upper surface of the circumference region 32 are formed to have equal height positions, or substantially equal height positions. The substrate 31 is supported, at the back side of the circumference region 32, to be on the support table 33. The central part of the support table 33 is open, and the position of the membrane region 30 is located in the opening part of the support table 33.

In the membrane region 30, there are formed apertured passage holes 25 (openings) through which multi-beams respectively pass at the positions each corresponding to each hole 22 of the aperture member 203 shown in FIGS. 2A and 2B. As shown in FIGS. 3 and 4, pairs (blankers: blanking deflectors) of the control electrode 24 (24a, 24b, 24c) and the counter electrode 26 (26a, 26b, 26c) for blanking deflection are arranged on the membrane region 30, and each of the pairs is close to and at opposite sides of a corresponding passage hole 25. Moreover, close to each passage hole 25 in the membrane region 30, there is arranged the control circuit 41 (logic circuit) for applying a deflection voltage to the control electrode 24 for each passage hole 25. The counter electrode 26 for each beam is grounded (earthed) through a pull-down resistor 60. Moreover, the counter electrode 26 for each beam is connected to a control circuit 43 (logic circuit: cancellation circuit). Preferably, a plurality of the counter electrodes 26 each for each beam on the blanking plate are grouped, and each group as a unit is connected to one control circuit 43. However, connection is not limited thereto. Each counter electrode 26 as a unit may be connected to one control circuit 43.

Moreover, as shown in FIG. 4, for example, 10-bit parallel lines for control signals are connected to each control circuit 41. In addition to the 10-bit parallel lines for control, for example, a clock signal line and a power source line are connected to each control circuit 41. Apart of the parallel lines may be used as the clock signal line and the power source line. A separate blanking system 47 composed of the control electrode 24, the counter electrode 26, and the control circuit 41 is configured for each beam of the multi-beams. Moreover, in the example of FIG. 3, the control electrode 24, the counter electrode 26, and the control circuit 41 are arranged in the membrane region 30, having a thin film thickness, of the substrate 31, and the control circuit 43 (cancellation circuit) is arranged in the circumference region 32, having a thick film thickness, of the substrate 31. However, arrangement is not limited thereto. The control circuit 43 may also be arranged in the membrane region 30 having a thin film thickness of the substrate 31.

The electron beam 20 passing through each passage hole 25 is deflected by voltages each independently applied to each of the pair of the two electrodes 24 and 26. Blanking control is provided by this deflection. In other words, each pair of the control electrode 24 and the counter electrode 26 provides a blanking deflection to a corresponding beam in multi-beams respectively having passed through a plurality of holes 22 (openings) of the aperture member 203.

Figure 5:
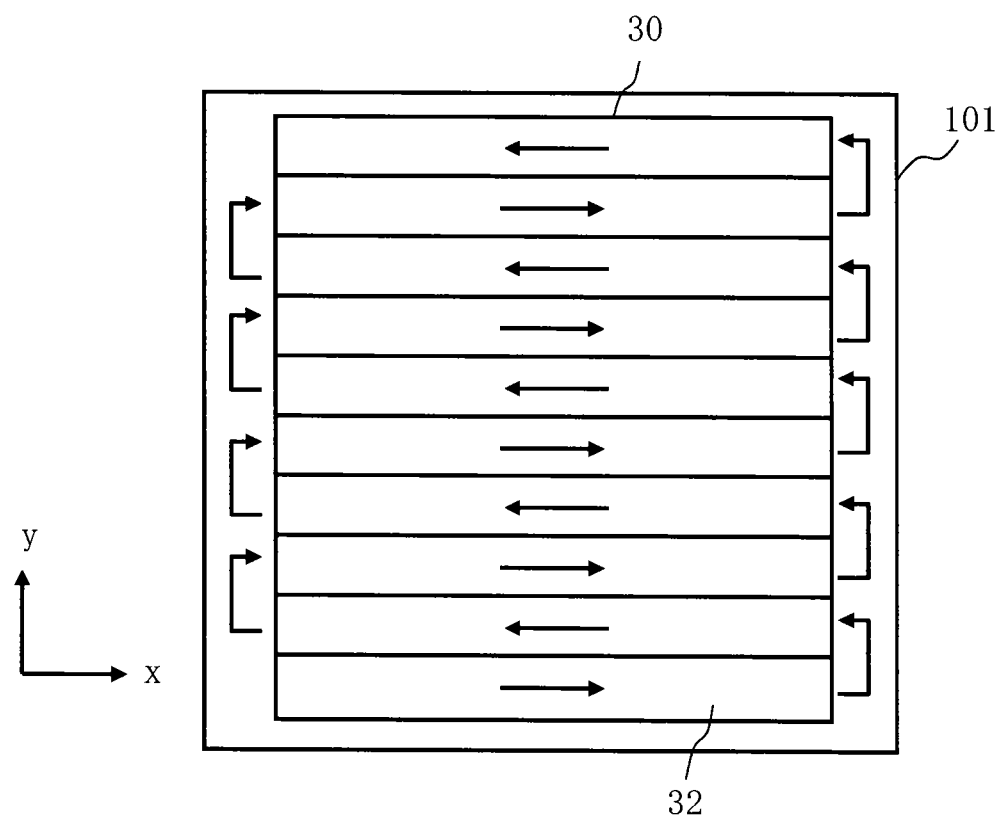
FIG. 5 is a conceptual diagram explaining an example of a writing operation according to the first embodiment.

FIG. 5 is a conceptual diagram explaining an example of a writing operation according to the first embodiment. As shown in FIG. 5, a writing region 30 of the target object 101 is virtually divided into a plurality of stripe regions 32 each in a strip shape and each having a predetermined width in the y direction, for example. Each of the stripe regions 32 serves as a unit region for writing. First, the XY stage 105 is moved to make an adjustment such that an irradiation region 34 which can be irradiated by one irradiation of the multi-beams 20 is located at the left end of the first stripe region 32 or at a position more left than the left end, and then writing is started. When writing the first stripe region 32, by moving the XY stage 105 in the −x direction, for example, the writing advances relatively in the x direction. The XY stage 105 is, for example, continuously moved at a predetermined speed. After writing the first stripe region 32, the stage position is moved in the −y direction to make an adjustment such that the irradiation region 34 is located at the right end of the second stripe region 32 or at a position more right than the right end to be relatively located in the y direction. Then, similarly, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, a plurality of shot patterns whose number is equal to the number of the holes 22 are formed at a time by multi-beams which have been formed by passing through respective corresponding holes 22 of the aperture member 203.

Figure 6:
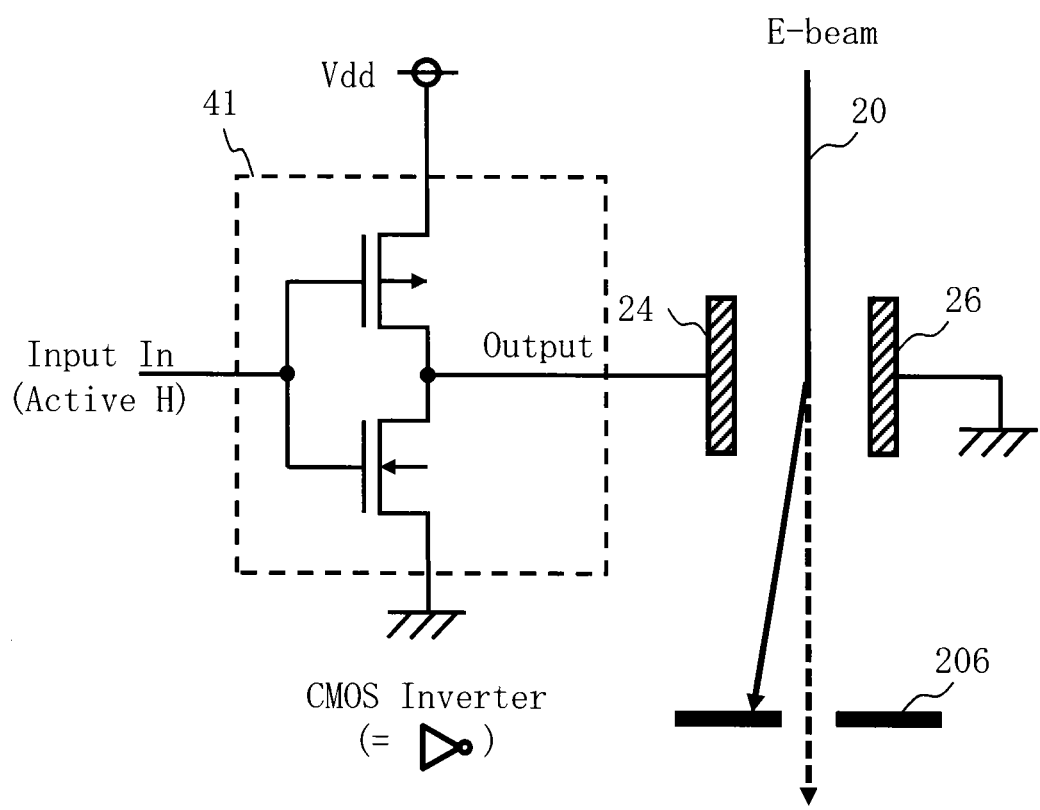
FIG. 6 shows an example of a separate blanking system of a comparative example of the first embodiment.

FIG. 6 shows an example of a separate blanking system of a comparative example of the first embodiment. As shown in FIG. 6, there is arranged a CMOS (complementary MOS) inverter circuit in the control circuit 41. The CMOS inverter circuit is connected to a positive potential (Vdd: first electric potential) (e.g., 3.3 V) and a ground potential (second electric potential). The output line (OUT) of the CMOS inverter circuit is connected to the control electrode 24. On the other hand, the counter electrode 26 is directly connected to the ground potential. As the input (IN) of the CMOS inverter circuit, either a L (low) electric potential (e.g., ground potential) lower than a threshold voltage, or a H (high) electric potential higher than or equal to the threshold voltage is applied serving as a control signal. According to the comparative example, in the state where an L electric potential is applied to the input (IN) of the CMOS inverter circuit, the output (OUT) of the CMOS inverter circuit becomes a positive potential (Vdd), and it is controlled to be beam OFF by deflecting a corresponding beam 20 by an electric field due to a potential difference against the potential (ground potential) of the counter electrode 26 and performing blocking using the limiting aperture member 206. On the other hand, in the state where an H electric potential is applied to the input (IN) of the CMOS inverter circuit, the output (OUT) of the CMOS inverter circuit becomes a ground potential. Since there is no potential difference against the potential (ground potential) of the counter electrode 26, a corresponding beam 20 is not deflected. Therefore, it is controlled to be beam ON by letting the beam pass through the limiting aperture member 206. Thus, the control circuit 41 (first potential applying mechanism, or "first potential applying circuit") alternatively selectively applies two different electric potentials (Vdd, and ground potential), for blanking control, for switching a corresponding beam of the multi-beams between a beam ON state and a beam OFF state, to the control electrode 24 (first electrode).

Here, if the output (OUT) becomes fixed to a ground potential due to a failure, etc. of the CMOS inverter circuit and it becomes uncontrollable, the potential of the control electrode 24 becomes fixed to a ground potential. Therefore, beams which pass such a separate blanking system always become beam ON (being fixed to beam ON). Consequently, unwanted beams (defective beams) irradiate the target object 101, thereby resulting in defective writing. Then, according to the first embodiment, when the electric potential of the control electrode 24 is always fixed to a ground potential, it is controlled to be beam OFF by controlling the potential of the counter electrode 26 to be different from the potential of the control electrode 24 so as to deflect a corresponding beam 20 and performing blocking using the limiting aperture member 206.

Figure 7:
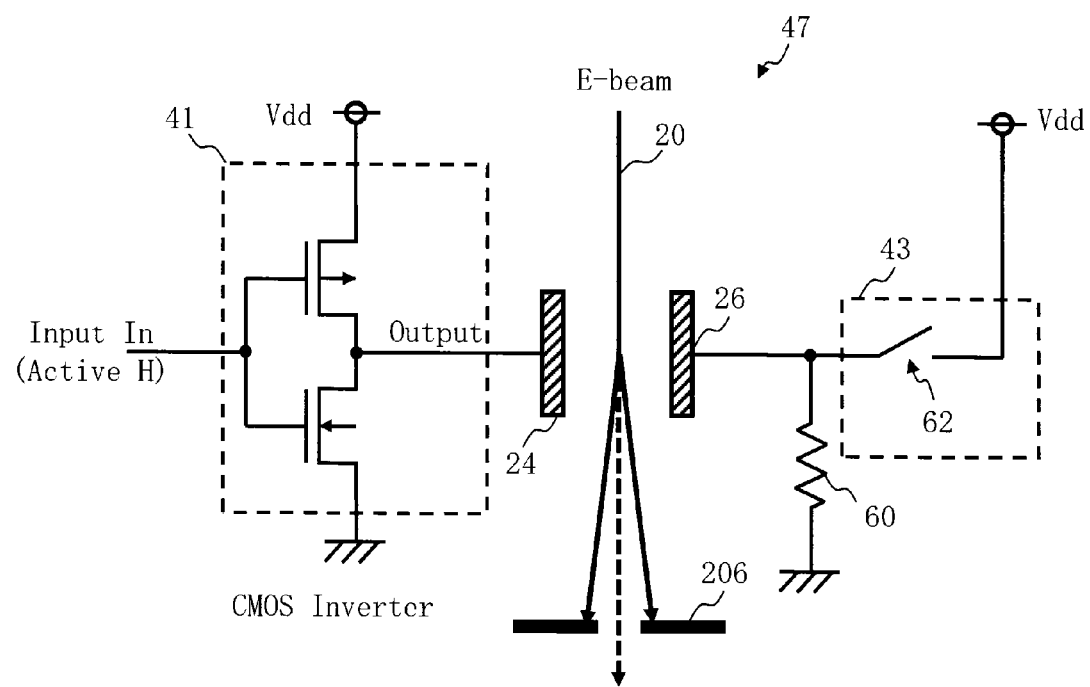
FIG. 7 shows an example of a separate blanking system according to the first embodiment.

FIG. 7 shows an example of a separate blanking system according to the first embodiment. In FIG. 7, the structure of the separate blanking system 47, at the control electrode 24 side, is the same as that of the comparative example of FIG. 6. In FIG. 7, although only the CMOS inverter circuit is shown in the control circuit 41, it goes without saying that unillustrated circuits for transmitting data or inputting a signal into the CMOS inverter circuit and like are arranged. For example, a shift register and a register are arranged for data transmission. For example, a shift register and a register for 10-bit data are arranged. Further, there is arranged a counter circuit for switching an input signal into the CMOS inverter circuit, based on a signal stored in the register. On the other hand, the counter electrode 26 is grounded through the pull-down resistor 60. Moreover, the counter electrode 26 is connected to the control circuit 43. A switch 62 (cancellation switch) is arranged in the control circuit 43. One of both the terminals of the switch 62 is connected to the counter electrode 26, and the other one is applied with a positive potential (Vdd). As the power source having a positive potential (Vdd), the power source having an electric potential applied to the CMOS inverter circuit of the control circuit 41 may be used. However, it is not limited thereto, and another power source having a positive potential may also be prepared. The resistance value of the pull-down resistor 60 is set to a sufficiently high value. For example, the resistance value is preferably greater than or equal to several tens of kΩ, and more preferably greater than or equal to 100 kΩ. Thereby, the electric power consumed by the pull-down resistor 60 when the switch 62 is turned ON (closed) can be small or substantially disregarded.

In this structure, the switch 62 is made to be OFF (open) when in the usual state (line connected to the control electrode 24 and the control circuit 41 are in a no-failure state) in which the electric potential of the control electrode 24 can be controlled to be alternatively selectively switched between a positive potential (Vdd) and a ground potential by the control circuit 41. Thereby, the electric potential of the counter electrode 26 becomes a ground potential in spite of there being the pull-down resistor 60 because the current does not flow, and thus, the usual separate blanking control can be performed. On the other hand, when the electric potential of the control electrode 24 is always fixed to a ground potential, the switch 62 is made to be ON (closed). Thereby, since the electric potential of the counter electrode 26 substantially becomes a positive potential (Vdd), a beam OFF state can be obtained by deflecting a corresponding beam toward the counter electrode 26, which is opposite to the direction of the usual blanking deflection, to irradiate the limiting aperture member 206 by the beam. In other words, when the electric potential of the control electrode 24 (first electrode) is fixed to a ground potential, the control circuit 43 (electric potential change mechanism or "electric potential change circuit") changes the potential of the counter electrode 26 (second electrode), which is grounded, to another potential from the ground potential. The electric potential applied to the switch 62 is not limited to the same electric potential as the positive potential for the output of the CMOS inverter circuit of the control circuit 41. What is necessary is to be a positive potential which can be deflected to make beams OFF when the electric potential of the control electrode 24 is a ground potential.

Although FIG. 7 shows a separate blanking system for one beam in the multi-beams, other separate blanking systems for remaining beams have the same configuration. In other words, the blanking plate 204 (blanking device) of the first embodiment includes a plurality of control electrodes 24 (first electrode), a plurality of control circuits 41 (first potential applying mechanism), a plurality of counter electrodes 26 (second electrode), and a plurality of control circuits 43 (electric potential change mechanism). The blanking plate 204 further includes a plurality of pull-down resistors 60. Each of a plurality of control circuits 41 alternatively selectively applies two different electric potentials, for blanking control, for switching a corresponding beam 20 of the multi-beams 20 (multi charged particle beam) between a beam ON state and a beam OFF state, to a corresponding one of a plurality of control electrodes 24. Each of a plurality of counter electrodes 26, which is grounded and paired with a corresponding one of a plurality of the control electrodes 24, provides a blanking deflection of a corresponding beam 20. Each of a plurality of pull-down resistors 60 is arranged between a corresponding one of a plurality of counter electrodes 26 and the ground. When the electric potential of a corresponding one of a plurality of control electrodes 24 is fixed to the ground potential, each of a plurality of control circuits 43 changes the electric potential of a corresponding one of a plurality of grounded counter electrodes 26 to another potential from the ground potential. In the example of FIG. 7, one end of each of a plurality of control circuits 43 is connected to a corresponding counter electrode 26.

While the control circuit 43 (cancellation circuit) may be arranged for each separate blanking system, it is not limited thereto. As shown in FIG. 4, a plurality of counter electrodes 26 on the blanking plate 204 may be grouped into a plurality of groups, and one control circuit 43 may be arranged for each group.

Figure 8:
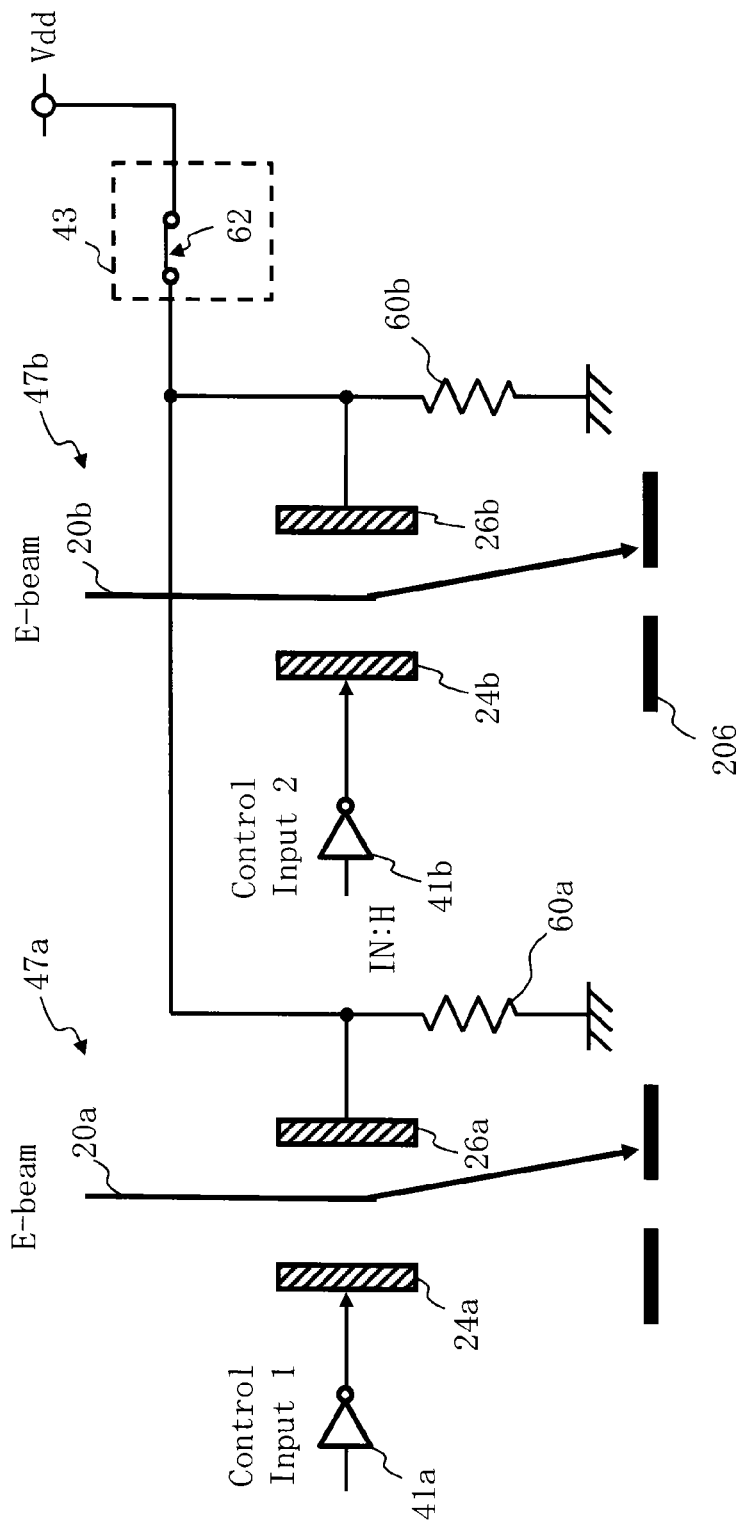
FIG. 8 shows an example of a structure in which one cancellation circuit is arranged for a plurality of separate blanking systems according to the first embodiment.

FIG. 8 shows an example of a structure in which one cancellation circuit is arranged for a plurality of separate blanking systems according to the first embodiment. As an example, FIG. 8 shows the case in which one control circuit 43 (cancellation circuit) is arranged for two separate blanking systems 47a and 47b. In the separate blanking system 47a, a control electrode 24a is connected to a control circuit 41a, and a counter electrode 26a is grounded through a pull-down resistor 60a. Similarly, in the separate blanking system 47b, a control electrode 24b is connected to a control circuit 41b, and a counter electrode 26b is grounded through a pull-down resistor 60b. Moreover, the counter electrode 26a is connected to the control circuit 43. Similarly, the counter electrode 26b is connected the control circuit 43. As described above, the switch 62 is arranged in the control circuit 43, and a positive potential (Vdd) is applied to the switch 62. By turning ON (closed) the switch 62, electric potentials of the counter electrodes 26a and 26b can simultaneously be positive potentials (Vdd). Therefore, when both the control electrodes 24a and 24b are always fixed to ground potentials, their beam ON states can be changed into beam OFF states at the same time. When one (e.g., control electrode 24a) of the control electrodes 24a and 24b is always fixed to a ground potential, the other one (e.g., control electrode 24b) is also made to be beam OFF, without performing the usual blanking control of the other one concerned. Therefore, in such a case, the output of the control circuit 41 to the other one (e.g., control electrode 24b) is intentionally controlled to be a ground potential.

Figure 9A:
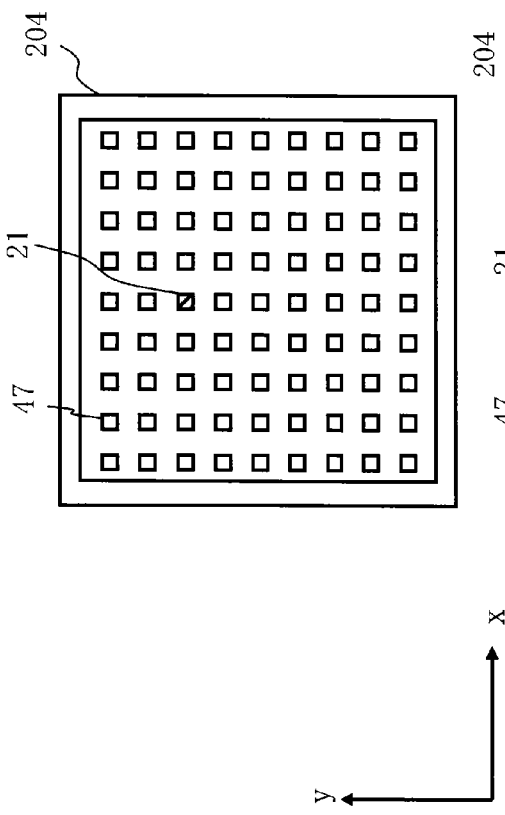
FIGS. 9A and 9B show an example of a grouping method according to the first embodiment.
Figure 9B:
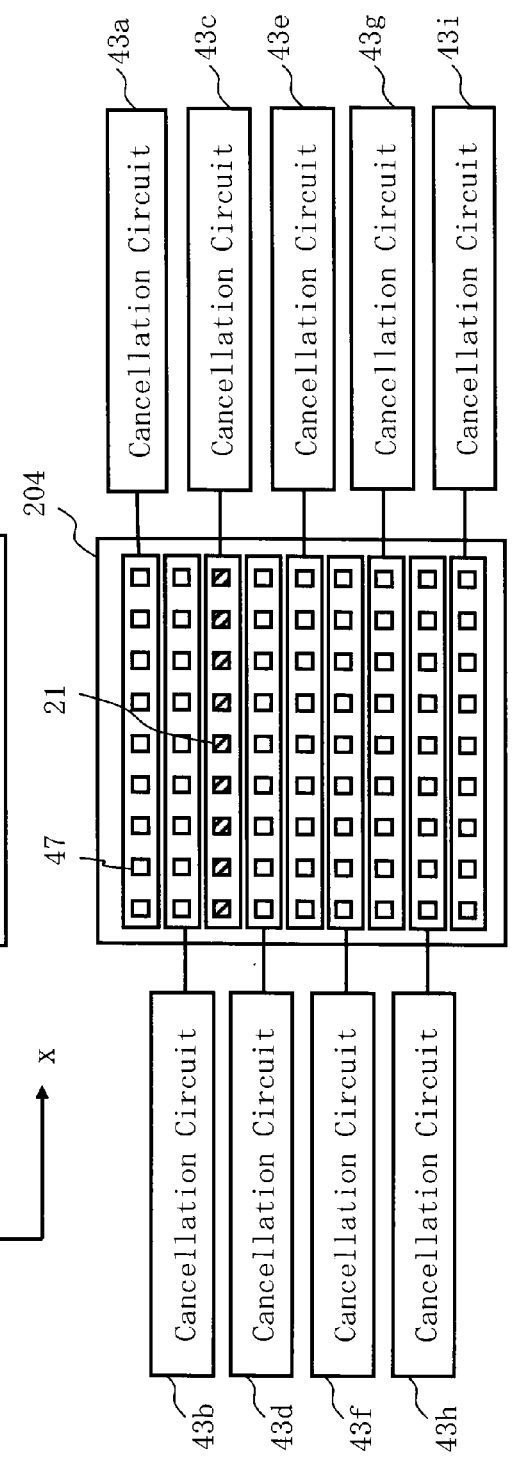

FIGS. 9A and 9B show an example of a grouping method according to the first embodiment. The example of FIG. 9A shows the case in which a defective separate blanking system 21 in the third row from the top and the fifth column from the left forms a defective beam being always fixed to beam ON, in 9×9, for example, separate blanking systems 47 on the blanking plate 204 for blanking-controlling the multi-beams 20. The example of FIG. 9B shows groups each composed of all the separate blanking systems 47 (in this case, nine separate blanking systems 479) in the same row in the direction of the x-axis, where the rows are arrayed in the y direction. One control circuit 43 (cancellation circuit) is arranged for each group. In the example of FIG. 9B, the control circuit 43a is arranged for a group of the separate blanking systems 47 in the first row from the top. The control circuit 43b is arranged for a group of the separate blanking systems 47 in the second row from the top. The control circuit 43c is arranged for a group of the separate blanking systems 47 in the third row from the top. The control circuit 43d is arranged for a group of the separate blanking systems 47 in the fourth row from the top. The control circuit 43e is arranged for a group of the separate blanking systems 47 in the fifth row from the top. Similarly, control circuits 43f to 43i are arranged respectively for groups of the separate blanking systems 47 in respective rows from the sixth to the ninth rows. As shown in FIG. 9B, each row (x direction) configures one group. When any one of the separate blanking systems 47 in a group forms a defective beam being always fixed to beam ON, it is controlled not to use the separate blanking systems 47 in the same row, for writing processing. In the case of FIG. 9B, the switch 62 in the control circuit 43 (cancellation circuit) is made to be ON (closed) with respect to the group in the third row from the top. It is controlled to apply a ground potential to the control electrode 24 from the control circuit 41 in each of the separate blanking systems 47 in the group other than the defective separate blanking system 21 which actually forms a defective beam being always fixed to beam ON. The switches 62 in the control circuits 43 (cancellation circuits) in the other groups are made to be OFF (open).

Figure 10:
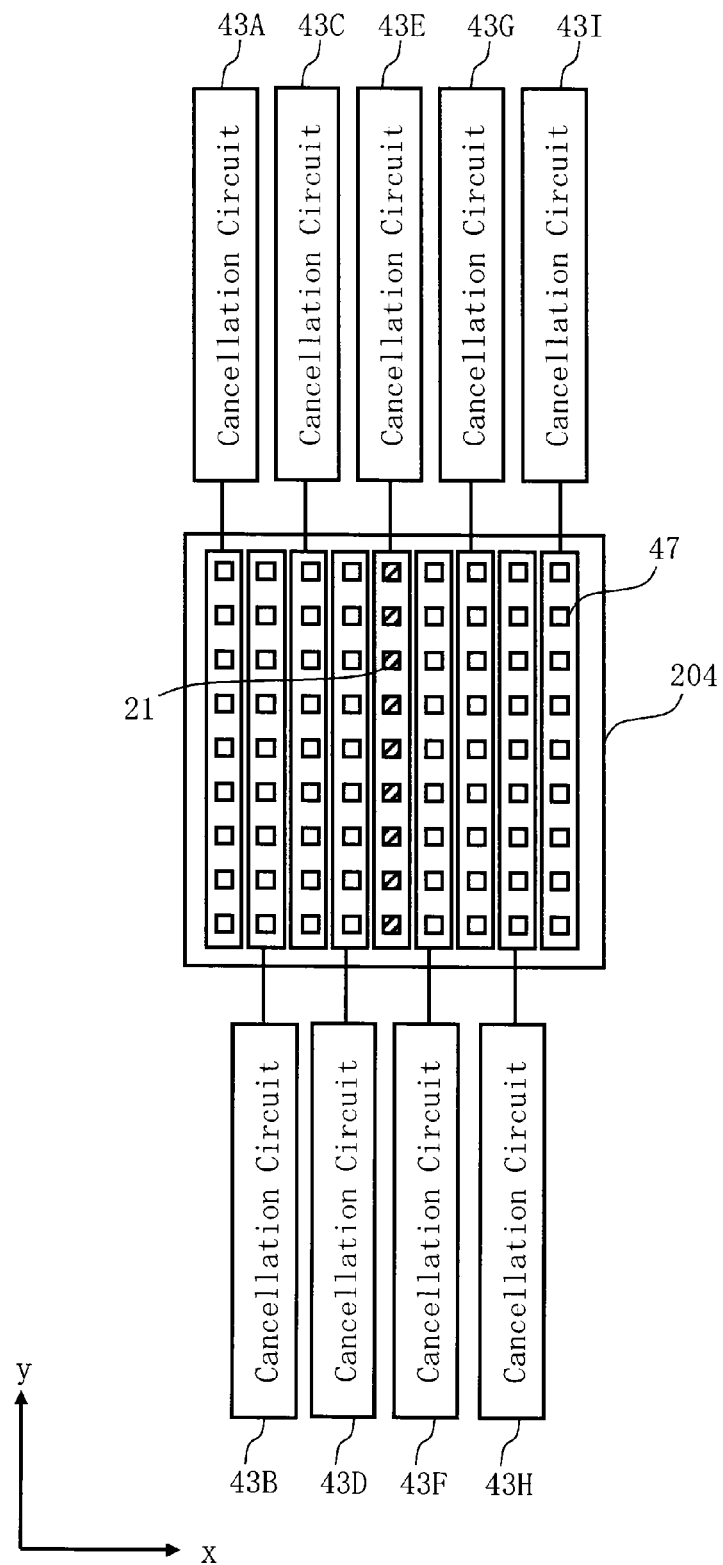
FIG. 10 shows another example of the grouping method according to the first embodiment.

FIG. 10 shows another example of the grouping method according to the first embodiment. The example of FIG. 10 shows groups each composed of all the separate blanking systems 47 (in this case, nine separate blanking systems 47) in the same column in the direction of the y-axis, where the columns are arrayed in the x direction. One control circuit 43 (cancellation circuit) is arranged for each group. In the example of FIG. 10, the control circuit 43A is arranged for a group of the separate blanking systems 47 in the first column from the left. The control circuit 43B is arranged for a group of the separate blanking systems 47 in the second column from the left. The control circuit 43C is arranged for a group of the separate blanking systems 47 in the third column from the left. The control circuit 43D is arranged for a group of the separate blanking systems 47 in the fourth column from the left. The control circuit 43E is arranged for a group of the separate blanking systems 47 in the fifth column from the left. Similarly, control circuits 43F to 43I are arranged respectively for groups of the separate blanking systems 47 in respective columns from the sixth to the ninth columns. As shown in FIG. 10, each column (y direction) configures one group. When any one of the separate blanking systems 47 in a group forms a defective beam being always fixed to beam ON, it is controlled not to use the separate blanking systems 47 in the same column, for writing processing.

In the case of FIG. 10, with respect to the group in the fifth column from the left, the switch 62 in the control circuit 43 (cancellation circuit) is made to be ON (closed). Then, it is controlled to apply a ground potential to the control electrode 24 from the control circuit 41 with respect to the separate blanking systems 47 in the group other than the defective separate blanking system 21 which actually forms a defective beam, being always fixed to beam ON. The switches 62 in the control circuits 43 (cancellation circuits) in the other groups are made to be OFF (open).

Figure 11:
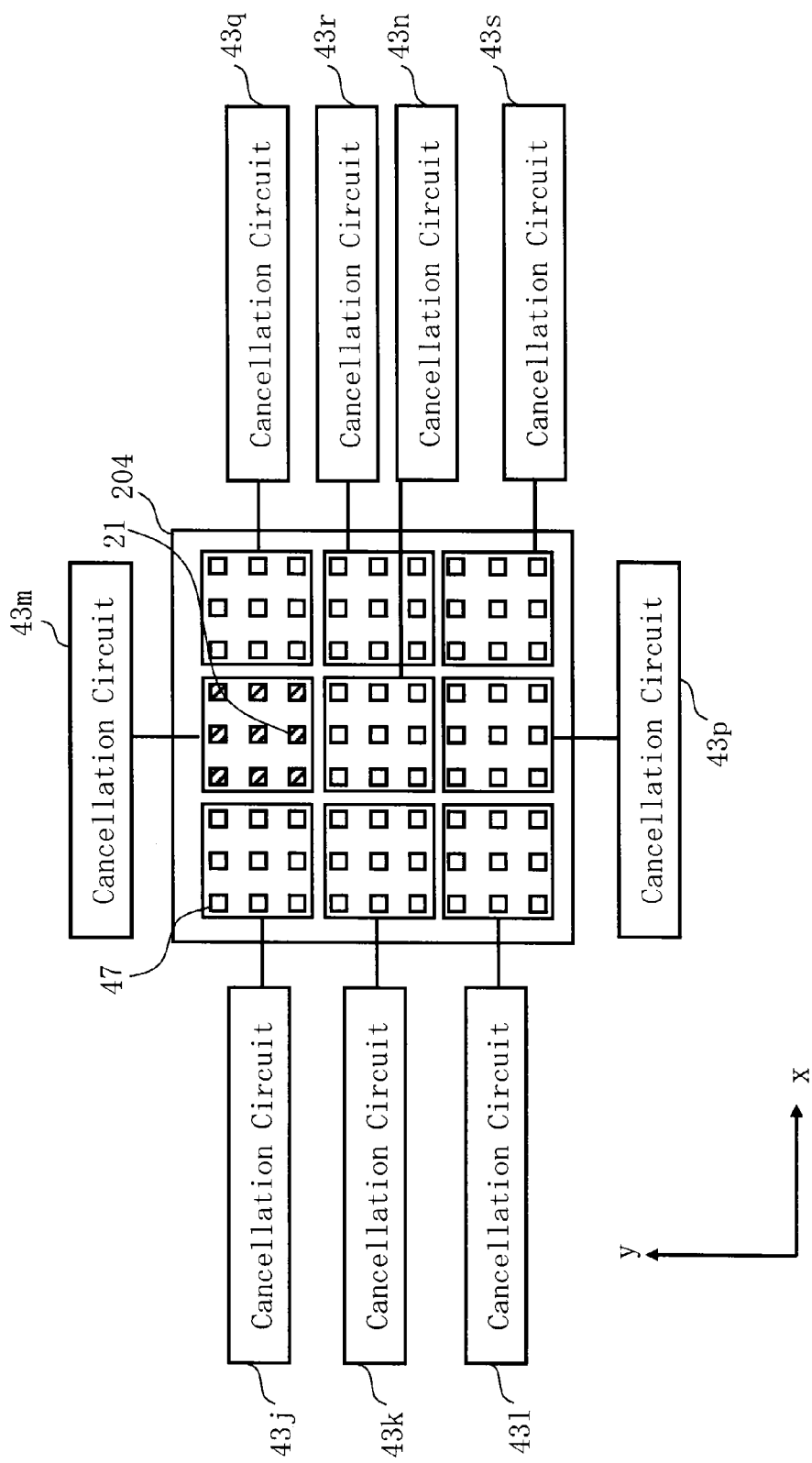
FIG. 11 shows another example of the grouping method according to the first embodiment.

FIG. 11 shows another example of the grouping method according to the first embodiment. In FIG. 11, one group is composed of m×m separate blanking systems 47 in the n×n separate blanking systems 47. In the case of FIG. 11, one group is composed of 3×3 separate blanking systems 47 in the 9×9 separate blanking systems 47, for example. One control circuit 43 (cancellation circuit) is arranged for each group. In the example of FIG. 11, a control circuit 43*j* is arranged for a left top group (group of first in x direction and first in −y direction from left top) of 3×3 separate blanking systems 47. A control circuit 43*k* is arranged for a left middle group (group of first in x direction and second in −y direction from left top) of 3×3 separate blanking systems 47. A control circuit 43*l* is arranged for a left bottom group (group of first in x direction and third in −y direction from left top) of 3×3 separate blanking systems 47. A control circuit 43*m* is arranged for a middle top group (group of second in x direction and first in −y direction from left top) of 3×3 separate blanking systems 47. A control circuit 43*n* is arranged for a middle middle group (group of second in x direction and second in −y direction from left top) of 3×3 separate blanking systems 47. A control circuit 43*p* is arranged for a middle bottom group (group of second in x direction and third in −y direction from left top) of 3×3 separate blanking systems 47. A control circuit 43*q* is arranged for a right top group (group of third in x direction and first in −y direction from left top) of 3×3 separate blanking systems 47. A control circuit 43*r* is arranged for a right middle group (group of third in x direction and second in −y direction from left top) of 3×3 separate blanking systems 47. A control circuit 43*s* is arranged for a right bottom group (group of third in x direction and third in −y direction from left top) of 3×3 separate blanking systems 47.

As shown in FIG. 11, one group is composed of the separate blanking systems 47 arrayed, in a block, in the width (x direction) and the length (y direction). It is not necessary for the numbers of the separate blanking systems 47 in the length array (y direction) and the width array (x direction) to be the same. When any one of the separate blanking systems 47 in a group forms a defective beam being always fixed to beam ON, it is controlled not to use the separate blanking systems 47 in the same group for writing processing. In the case of FIG. 11, with respect to the middle top group of 3×3 separate blanking systems 47, the switch 62 in the control circuit 43 (cancellation circuit) is made to be ON (closed). Then, it is controlled to apply a ground potential to the control electrode 24 from the control circuit 41 with respect to the separate blanking systems 47 in the group other than the defective separate blanking system 21 which actually forms a defective beam being always fixed to beam ON. The switches 62 in the control circuits 43 (cancellation circuits) in the other groups are made to be OFF (open).

Operations of the writing apparatus 100 in which the blanking plate 204 described above has been mounted will be explained below.

First, in the inspection step, it is inspected whether the defective separate blanking system 21 which forms a defective beam being always fixed to beam ON exists in the blanking plate 204. For example, the XY stage 105 is moved so that the Faraday cup 106 may be located at the position irradiated by the beam which is blanking-controlled by the separate blanking system 47 to be inspected. Multi-beams are emitted while performing blanking control to make all the beams OFF. Then, the measurement unit 50 measures the amount of current detected by the Faraday cup 106.

Next, in the determination step, the determination unit 52 determines whether the separate blanking system 47 to be inspected is a defective separate blanking system which forms a defective beam. If current is detected in spite of having controlled to be beam OFF, it can be determined that the separate blanking system 47 which controls the beam concerned is defective.

By executing this step for all the beams, it is possible to determine which separate blanking system 47 is a defective separate blanking system.

If the Faraday cup 106 is not able to perform detection for only one beam but performs detection for beams extending over a plurality of beam irradiation positions, there is a possibility that the Faraday cup 106 detects a beam having passed through the separate blanking systems 47 other than the separate blanking system 47 to be inspected. In such a case, the switch 62 of the group to which the separate blanking system 47 to be inspected belongs is made to be OFF (open), and each control circuit 41 in the group including the separate blanking system 47 to be inspected provides blanking control to make all the beams OFF. On the other hand, with respect to a group to which the separate blanking systems 47 forming a surrounding beam (not a target to be inspected) that may be detected by the Faraday cup 106 belongs and which is different from the group concerned, each switch 62 is made to be ON (open), and the control circuit 41 performs controlling to apply a ground potential to the control electrode 24. Multi-beams are emitted in this state. The measurement unit 50 measures the amount of current detected by the Faraday cup 106.

Next, in the determination step, the determination unit 52 determines whether the defective separate blanking system 21 is included in the group to be inspected. If current is detected in spite of having controlled to be beam OFF, it can be determined that the defective separate blanking system 21 is included in the group concerned.

By contrast, if current is not detected, it turns out that the current detected at the beginning is due to the beam formed by the separate blanking system 47 in a group different from the group to which the separate blanking system 47 to be inspected belongs. In such a case, inspection may be performed in order for each group. In the inspection step, with respect to the group to be inspected, multi-beams are emitted while performing control to make all the beams OFF, in the state where the switch 62 has been made to be OFF. On the other hand, with respect to the groups other than the group to be inspected, the switch 62 is made to be ON, and the control circuit 41 performs controlling to apply a ground potential to the control electrode 24. Then, the measurement unit 50 measures the amount of current detected by the Faraday cup 106.

Next, in the determination step, the determination unit 52 determines whether the defective separate blanking system 21 is included in the group to be inspected. If current is detected in spite of having controlled to be beam OFF, it can be determined that the defective separate blanking system 21 is included in the group concerned. If the group including the defective separate blanking system 21 can be specified, it is not necessary to further specify the defective separate blanking system 21. What is necessary is not to use the group concerned itself in the writing processing.

The cancellation circuit control unit 54 performs controlling so that beam fixation to ON may be removed with respect to the control circuit 43 for the group including the defective separate blanking system 21. According to the first embodiment, the switch 62 of the target control circuit 43 is made to be ON (open). The adjustment unit 55 adjusts a control signal so that, with respect to the control circuit 41 of each separate blanking system 47 in the group concerned, a ground potential may be applied to the control electrode 24. For making a determination, it is also preferable to check the beam state by using a scintillator (not shown) instead of the Faraday cup 106.

Then, writing processing is started. Specifically, the data processing unit 56 reads writing data from the storage device 140, and calculates the area density of a pattern arranged in each mesh region of a plurality of mesh regions obtained by virtually dividing the writing region of the target object 101 or a chip region to be written into meshes. For example, the writing region of the target object 101 or a chip region to be written is divided into strip-shaped stripe regions each having a predetermined width. Then, each stripe region is virtually divided into a plurality of mesh regions described above. Preferably, the size of a mesh region is, for example, a beam size, or smaller than a beam size. For example, the size of a mesh region is preferably about 10 nm. The data processing unit 56 reads corresponding writing data from the storage device 140 for each stripe region, and assigns a plurality of figure patterns defined in the writing data to a mesh region, for example. Then, the area density of a figure pattern arranged in each mesh region is calculated.

The data processing unit 56 calculates an irradiation time T (which hereinafter will also be called a shot time or an exposure time) of the electron beam per shot, for each predetermined sized mesh region. When performing multi-pass writing, an irradiation time T of the electron beam per shot in each hierarchy (or "each writing process") of multi-pass writing is calculated. It is preferable to obtain the irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations (not shown), such as a proximity effect, a fogging effect, or a loading effect. The size of a plurality of mesh regions for defining the irradiation time T and the size of a plurality of mesh regions where a pattern area density has been defined may be the same size or different sizes. When they are different sizes, each irradiation time T should be calculated after interpolating the area density by linear interpolation, etc. The irradiation time T for each mesh region is defined in an irradiation time map, and the irradiation time map is stored in the storage device 142, for example.

Moreover, the data processing unit 56 converts the data of the irradiation time of a corresponding beam into 10-bit data, for example, and generates irradiation time arrangement data. The generated irradiation time arrangement data is output to the deflection control circuit 130.

For each shot, the deflection control circuit 130 outputs irradiation time arrangement data to each control circuit 41.

In the writing step, under the control of the writing control unit 58, the writing unit 150 performs writing corresponding to the irradiation time concerned, for each shot of each beam. Specifically, it operates as described below.

The electron beam 200 emitted from the electron gun assembly 201 (emission unit) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated by the electron beam 200. For example, a plurality of quadrangular electron beams (multi-beams) 20a to 20e are formed by letting portions of the electron beam 200, which is irradiating the positions of a plurality of holes, respectively pass through a corresponding hole of the plurality of holes of the aperture member 203. The multi-beams 20a to 20e respectively pass through corresponding blankers (first deflectors: separate blanking systems) of the blanking plate 204. Each blanker deflects (performs blanking deflection) a separately passing electron beam 20.

The multi-beams 20a, 20b, . . . , 20e having passed through the blanking plate 204 are reduced by the reducing lens 205, and travel toward the hole in the center of the limiting aperture member 206. At this time, the electron beam 20 deflected by the blanker of the blanking plate 204 deviates from the hole in the center of the limiting aperture member 206 (blanking aperture member) and is blocked by the limiting aperture member 206. On the other hand, the electron beam 20 which was not deflected by the blanker of the blanking plate 204 passes through the hole in the center of the limiting aperture member 206 as shown in FIG. 1. Blanking control is performed by ON/OFF of the separate blanking system in order to control ON/OFF of the beam. Thus, the limiting aperture member 206 blocks each beam which was deflected to be beam OFF by the separate blanking system. One beam shot is formed by a beam which has been formed during from a beam ON state to a beam OFF state and has passed through the limiting aperture member 206. The multi beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective writing positions (irradiation positions) on the target object 101. Moreover, for example, while the XY stage 105 is continuously moving, the deflector 208 controls such that irradiation positions of beams follow the movement of the XY stage 105. The position of the XY stage 105 is measured by using a reflected light which is obtained by irradiating a laser onto the mirror 210 on the XY stage 105 from the stage position detector 139. Ideally, multi-beams 20 to irradiate at a time are aligned at pitches obtained by multiplying the arrangement pitch of a plurality of holes of the aperture member 203 by the desired reduction ratio described above. The writing apparatus 100 executes a writing operation by the raster scan method that sequentially performs irradiation of a shot beam in order, and when writing a desired pattern, a beam needed according to a pattern is controlled to be beam ON by blanking control.

According to the first embodiment, since the group including a defective separate blanking system is removed from the writing processing, the irradiation positions which should have been written by beams passing through the separate blanking systems 47 in the group concerned have not been written. Then, according to the first embodiment, an additional exposure is performed so that such irradiation positions may be written.

Figure 12C:
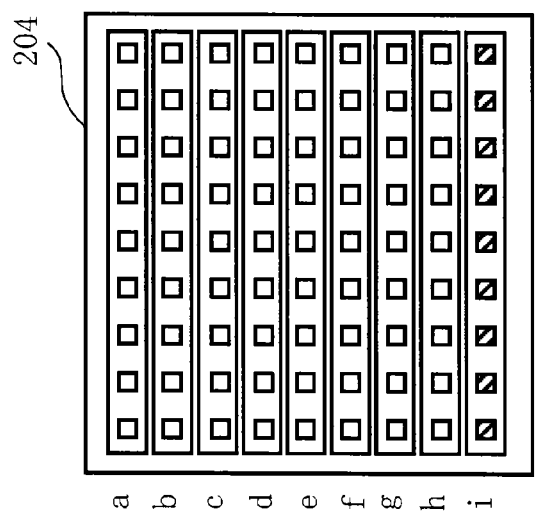
FIGS. 12A to 12C illustrate an example of multiple exposure according to the first embodiment.
Figure 12B:
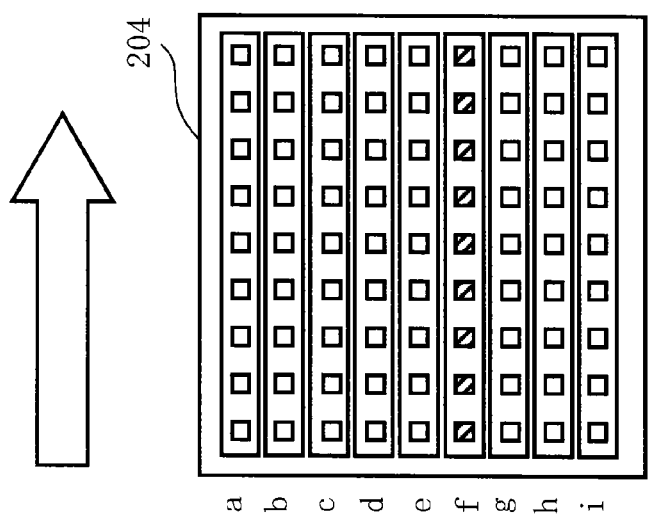
Figure 12A:
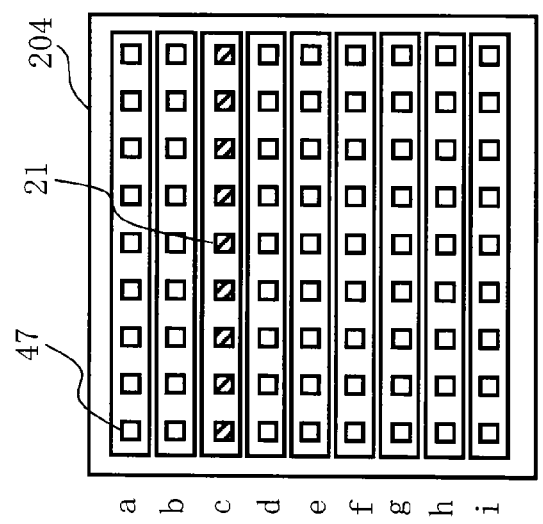

FIGS. 12A to 12C illustrate an example of multiple exposure according to the first embodiment. FIG. 12A shows an example of an exposure step in the case where one group is composed of all the separate blanking systems in the same row in the direction of the x-axis, where the rows are arrayed in the y direction. As shown in FIG. 12A, groups a to i are sequentially configured from the top in the blanking plate 204. In this case, the defective separate blanking system 21 is included in the group c in the third row from the top, and the multiplicity (N) is N=2.

In the first multi-beam irradiation in multiple exposure, since the beams by the group c in the third row from the top shown in FIG. 12A are not radiated, the irradiation positions of the beams by the group c on the target object are not exposed. Then, in the second multi-beam irradiation in multiple exposure, exposure is performed after shifting the position of the blanking plate 204 relatively in the y direction by moving the position of the XY stage 105 as shown in FIG. 12B. At this time, the position is arranged such that the irradiation positions of the beams by the group c, which were not irradiated in the first multi-beam irradiation, are exposed by a group not including a defective beam. In the case of FIG. 12B, the positions which were not irradiated in the first multi-beam irradiation are exposed by the group f. On the other hand, the irradiation positions of the beams by the group c shown in FIG. 12B are not irradiated in the second multi-beam irradiation. Therefore, when the second multi-beam irradiation has been completed, the irradiation positions of the beams by the group c shown in FIG. 12B and the irradiation positions of the beams by the group f shown in FIG. 12B have been irradiated only once. With respect to the irradiation positions of the beams by the other groups, multiple exposures have been performed (written) twice. Then, according to the first embodiment, the third multi-beam irradiation in multiple exposure is executed as an additional exposure. In the third multi-beam irradiation, exposure is performed after shifting the position of the blanking plate 204 relatively in the y direction by moving the position of the XY stage 105 as shown in FIG. 12C. At this time, the position is arranged such that the irradiation positions of the beams by the group c, which were not irradiated in the first and second multi-beam irradiation, are exposed by a group not including a defective beam. In the case of FIG. 12C, the positions which were not irradiated in the first multi-beam irradiation are exposed by the group i, and the positions which were not irradiated in the second multi-beam irradiation are exposed by the group f. At this time, blanking control is provided so that it may be beam OFF in the other groups. Thereby, multi-beam irradiation has been performed twice at all the positions, and therefore, the multiple writing of multiplicity N=2 is completed.

Although the additional exposure is performed for the positions which were not irradiated, it is not limited thereto. When the group f shown in FIG. 12B exposes the positions for which were not irradiated in the first multi-beam irradiation, it is also preferable to perform the exposure (irradiation) with a dose for two irradiation times.

FIGS. 13A to 13C illustrate another example of multiple exposure according to the first embodiment. FIG. 13A shows an example of an exposure step in the case where one group is composed of all the separate blanking systems in the same column in the direction of the y-axis, where the columns are arrayed in the x direction. As shown in FIG. 13A, groups A to I are sequentially configured from the left in the blanking plate 204. In this case, the defective separate blanking system 21 is included in the group E in the fifth column from the left, and the multiplicity (N) is N=2.

In the first multi-beam irradiation in multiple exposure, since the beams by the group E in the fifth column from the left shown in FIG. 13A are not radiated, the irradiation positions of the beams by the group E on the target object are not exposed. Then, in the second multi-beam irradiation in multiple exposure shown in FIG. 13B, exposure is performed after shifting the position of the blanking plate 204 relatively in the x direction by moving the position of the XY stage 105. At this time, the position is arranged such that the irradiation positions of the beams by the group E, which were not irradiated in the first multi-beam irradiation, are exposed by a group not including a defective beam. In the case of FIG. 13B, the positions which were not irradiated in the first multi-beam irradiation are exposed by the group D. On the other hand, the irradiation positions of the beams by the group E shown in FIG. 13B are not irradiated in the second multi-beam irradiation. Therefore, when the second multi-beam irradiation has been completed, the irradiation positions of the beams by the group E shown in FIG. 13B and the irradiation positions of the beams by the group D shown in FIG. 13B have been irradiated only once. With respect to the irradiation positions of the beams by the other groups, multiple exposures have been performed (written) twice. Then, according to the first embodiment, the third multi-beam irradiation in multiple exposure is executed as an additional exposure. In the third multi-beam irradiation, exposure is performed after shifting the position of the blanking plate 204 relatively in the x direction by moving the position of the XY stage 105 as shown in FIG. 13C. At this time, the position is arranged such that the irradiation positions of the beams by the group E, which were not irradiated in the first and second multi-beam irradiation, are exposed by a group not including a defective beam. In the case of FIG. 13C, the positions which were not irradiated in the first multi-beam irradiation are exposed by the group C, and the positions which were not irradiated in the second multi-beam irradiation are exposed by the group D. At this time, blanking control is provided so that it may be beam OFF in the other groups. Thereby, multi-beam irradiation has been performed twice at all the positions, and therefore, the multiple writing of multiplicity N=2 is completed.

Although the additional exposure is performed for the positions which were not irradiated, it is not limited thereto. When the group D shown in FIG. 13B exposes the positions which were not irradiated in the first multi-beam irradiation, it is also preferable to perform the exposure (irradiation) with a dose for two irradiation times.

FIGS. 14A to 14C illustrate another example of multiple exposure according to the first embodiment. In FIG. 14A, one group is composed of m×m separate blanking systems 47. FIG. 14A shows a case of an exposure step in the case where one group is composed of 3×3 separate blanking systems 47 in the 9×9 separate blanking systems 47, for example. In FIG. 14A, in the blanking plate 204, there are j, k, and l groups arrayed in the −y direction respectively at the left top, left middle, and left bottom, m, n, and p groups arrayed in the −y direction respectively at the middle top, middle middle, and middle bottom, and q, r, and s groups arrayed in the −y direction respectively at the right top, right middle, and right bottom. In this case, the defective separate blanking system 21 is included in the middle top group m, and the multiplicity (N) is N=2.

In the first multi-beam irradiation in multiple exposure, since the beams by the group m at the middle top shown in FIG. 14A are not radiated, the irradiation positions of the beams by the group m on the target object are not exposed. Then, in the second multi-beam irradiation in multiple exposure, exposure is performed after shifting the position of the blanking plate 204 relatively in the y direction by moving the position of the XY stage 105 as shown in FIG. 14B. At this time, the position is arranged such that the irradiation positions of the beams by the group m, which were not irradiated in the first multi-beam irradiation, are exposed by a group not including a defective beam. In the case of FIG. 14B, the positions which were not irradiated in the first multi-beam irradiation are exposed by the group n. On the other hand, the irradiation positions of the beams by the group m shown in FIG. 14B are not irradiated in the second multi-beam irradiation. Therefore, when the second multi-beam irradiation has been completed, the irradiation positions of the beams by the group n shown in FIG. 14B and the irradiation positions of the beams by the group m shown in FIG. 14B have been irradiated only once. With respect to the irradiation positions of the beams by the other groups, multiple exposures have been performed (written) twice. Then, according to the first embodiment, the third multi-beam irradiation in multiple exposure is executed as an additional exposure. In the third multi-beam irradiation, exposure is performed after shifting the position of the blanking plate 204 relatively in the y direction by moving the position of the XY stage 105 as shown in FIG. 14C. At this time, the position is arranged such that the irradiation positions of the beams by the group m, which were not irradiated in the first and second multi-beam irradiation, are exposed by a group not including a defective beam. In the case of FIG. 14C, the positions which were not irradiated in the first multi-beam irradiation are exposed by the group p, and the positions which were not irradiated in the second multi-beam irradiation are exposed by the group n. At this time, blanking control is provided so that it may be beam OFF in the other groups. Thereby, multi-beam irradiation has been performed twice at all the positions, and therefore, the multiple writing of multiplicity N=2 is completed.

Although the additional exposure is performed for the positions which were not irradiated, it is not limited thereto. When the group n shown in FIG. 14B exposes the positions which were not irradiated in the first multi-beam irradiation, it is also preferable to perform the exposure (irradiation) with a dose for two irradiation times.

FIGS. 15A to 15C illustrate another example of multiple exposure according to the first embodiment. In FIG. 15A, one group is composed of m×m separate blanking systems 47. FIG. 15A shows a case of an exposure step in the case where one group is composed of 3×3 separate blanking systems 47 in the 9×9 separate blanking systems 47, for example. In FIG. 15A, there are groups j to s, similarly to FIG. 14A. The defective separate blanking system 21 is included in the right top (third in x direction from left top) group q, and the multiplicity (N) is N=2.

In the first multi-beam irradiation in multiple exposure, since the beams by the group q at the right top shown in FIG. 15A are not radiated, the irradiation positions of the beams by the group q on the target object are not exposed. Then, in the second multi-beam irradiation in multiple exposure, exposure is performed after shifting the position of the blanking plate 204 relatively in the x direction by moving the position of the XY stage 105 as shown in FIG. 15B. At this time, the position is arranged such that the irradiation positions of the beams by the group q, which were not irradiated in the first multi-beam irradiation, are exposed by a group not including a defective beam. In the case of FIG. 15B, the positions which were not irradiated in the first multi-beam irradiation are exposed by the group m. On the other hand, the irradiation positions of the beams by the group q shown in FIG. 15B are not irradiated in the second multi-beam irradiation. Therefore, when the second multi-beam irradiation has been completed, the irradiation positions of the beams by the group m shown in FIG. 15B and the irradiation positions of the beams by the group q shown in FIG. 15B have been irradiated only once. With respect to the irradiation positions of the beams by the other groups, multiple exposures have been performed (written) twice. Then, according to the first embodiment, the third multi-beam irradiation in multiple exposure is executed as an additional exposure. In the third multi-beam irradiation, exposure is performed after shifting the position of the blanking plate 204 relatively in the x direction by moving the position of the XY stage 105 as shown in FIG. 15C. At this time, the position is arranged such that the irradiation positions of the beams by the group q, which were not irradiated in the first and second multi-beam irradiation, are exposed by a group not including a defective beam. In the case of FIG. 15C, the positions which were not irradiated in the first multi-beam irradiation are exposed by the group j, and the positions which were not irradiated in the second multi-beam irradiation are exposed by the group m. At this time, blanking control is provided so that it may be beam OFF in the other groups. Thereby, multi-beam irradiation has been performed twice at all the positions, and therefore, the multiple writing of multiplicity N=2 is completed.

Although the additional exposure is performed for the positions which were not irradiated, it is not limited thereto. When the group m shown in FIG. 15B exposes the positions which were not irradiated in the first multi-beam irradiation, it is also preferable to perform the exposure (irradiation) with a dose for two irradiation times.

As described above, according to the first embodiment, even when the defective separate blanking system 21 being always fixed to beam ON exists, it is possible to convert the state of being always fixed to beam ON to the state of being always fixed to beam OFF by applying a voltage to the counter electrode 26 of the defective separate blanking system 21 by using the cancellation circuit (control circuit 43).

Thus, according to the first embodiment, it is possible to eliminate defective beams being fixed to beam ON thereby resulting in uncontrollable blanking. Accordingly, the blanking plate 204 (blanking device) including the defective separate blanking system 21 can be used as it is without exchange. Furthermore, even when using the blanking plate 204 including the defective separate blanking system. 21, highly accurate writing can be performed.

Second Embodiment

Although, in the first embodiment, there has been described the case of applying a positive potential to the counter electrode 26, it is not limited thereto. According to the second embodiment, a configuration in which a negative electric potential is applied will be described. The configuration of the writing apparatus 100 is the same as that of FIG. 1. The contents of the present embodiment may be the same as those of the first embodiment except what is described below.

Figure 16:
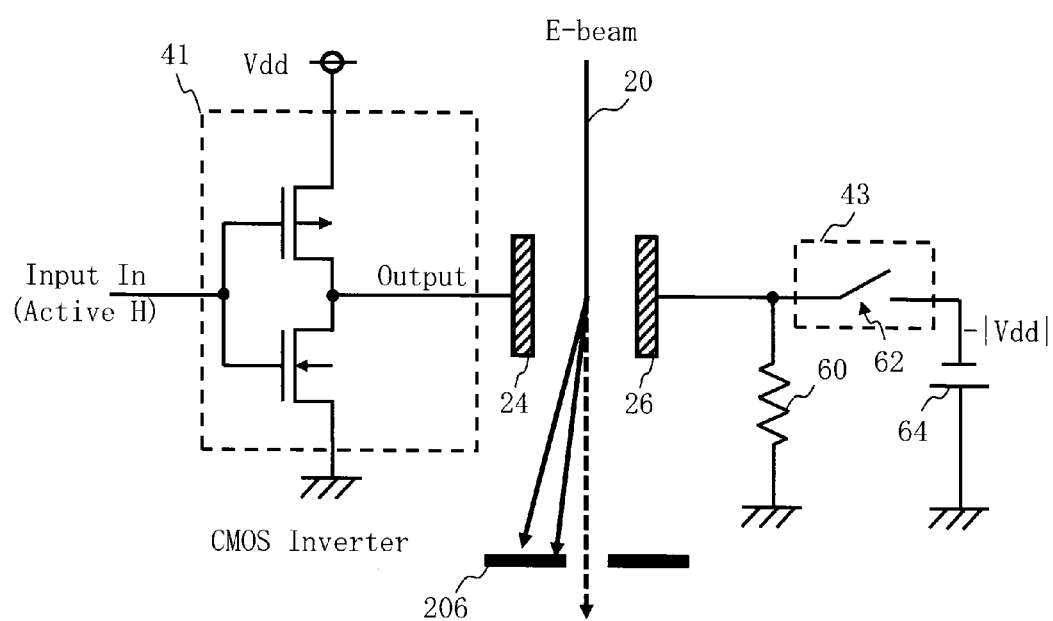
FIG. 16 shows an example of a separate blanking system according to a second embodiment.

FIG. 16 shows an example of a separate blanking system according to the second embodiment. In FIG. 16, the structure of the separate blanking system 47, at the control electrode 24 side, is the same as that of FIG. 7 or 8. Similarly to the description of FIG. 8, although only the CMOS inverter circuit is shown in the control circuit 41, it goes without saying that unillustrated circuits for transmitting data or inputting a signal into the CMOS inverter circuit, and like are arranged. On the other hand, the counter electrode 26 is grounded through the pull-down resistor 60. Moreover, the counter electrode 26 is connected to the control circuit 43. The switch 62 (cancellation switch) is arranged in the control circuit 43. One of both the terminals of the switch 62 is connected to the counter electrode 26, and the other one is connected to the negative electrode of a direct-current power source 64. The positive electrode of the direct-current power source 64 is grounded. Therefore, a negative electric potential (−|Vdd|) (e.g., −3.3V) is applied to the switch 62. The resistance value of the pull-down resistor 60 is set to a sufficiently high value. For example, the resistance value is preferably greater than or equal to several tens of kΩ, and more preferably greater than or equal to 100 kΩ. Thereby, the electric power consumed by the pull-down resistor 60 when the switch 62 is turned ON (closed) can be small or substantially disregarded.

In this structure, the switch 62 is made to be OFF (open) when in the usual state (line connected to the control electrode 24 and the control circuit 41 are in a no-failure state) in which the electric potential of the control electrode 24 can be controlled to be alternatively selectively switched between a positive potential (Vdd) and a ground potential by the control circuit 41. Thereby, the electric potential of the counter electrode 26 becomes a ground potential in spite of there being the pull-down resistor 60 because the current does not flow, and thus, usual separate blanking control can be performed. On the other hand, when the electric potential of the control electrode 24 is always fixed to a ground potential, the switch 62 is made to be ON (closed). Thereby, since the electric potential of the counter electrode 26 substantially becomes a negative potential (−|Vdd|), a beam OFF state can be obtained by deflecting a corresponding beam toward the control electrode 24, which is the same direction as that of the usual blanking deflection, to irradiate the limiting aperture member 206 by the beam. In other words, when the electric potential of the control electrode 24 (first electrode) is fixed to a ground potential, the control circuit 43 (electric potential change mechanism) changes the potential of the counter electrode 26 (second electrode), which is grounded, to a negative potential from the ground potential. The electric potential applied to the switch 62 is not limited to a sign-reversed electric potential of the same electric potential as the positive potential (Vdd) for the output of the CMOS inverter circuit of the control circuit 41. What is necessary is to be a negative potential which can be deflected to make beams OFF when the electric potential of the control electrode 24 is a ground potential. When letting the counter electrode 26 be a negative electric potential, it is not necessary to adjust the electric potential of the normal control electrode 24. This is because, even when it is beam ON, i.e., the case in which the electric potential of the control electrode becomes a ground potential, since the counter electrode is a negative electric potential, it becomes beam OFF.

Although FIG. 16 shows a separate blanking system for one beam in the multi-beams, other separate blanking systems for remaining beams have the same configuration. In other words, the blanking plate 204 (blanking device) of the second embodiment includes a plurality of control electrodes 24 (first electrode), a plurality of control circuits 41 (first potential applying mechanism), a plurality of counter electrodes 26 (second electrode), and a plurality of control circuits 43 (electric potential change mechanism). The blanking plate 204 further includes a plurality of pull-down resistors 60. Each of a plurality of control circuits 41 alternatively selectively applies two different electric potentials, for blanking control, for switching a corresponding beam 20 of the multi-beams 20 (multi charged particle beam) between a beam ON state and a beam OFF state, to a corresponding one of a plurality of control electrodes 24. Each of a plurality of counter electrodes 26, which is grounded and paired with a corresponding one of a plurality of of the control electrodes 24, provides a blanking deflection of a corresponding beam 20. Each of a plurality of pull-down resistors 60 is arranged between a corresponding one of a plurality of counter electrodes 26 and the ground. Each of a plurality of control circuits 43 changes the electric potential of a corresponding one of a plurality of grounded counter electrodes 26 to a negative potential from the ground potential when the electric potential of a corresponding one of a plurality of control electrodes 24 is fixed to the ground potential. In the example of FIG. 16, one end of each of a plurality of control circuits 43 is connected to a corresponding counter electrode 26, and the other end is applied with a negative potential (−|Vdd|).

While the control circuit 43 (cancellation circuit) may be arranged for each separate blanking system, it is not limited thereto. As shown in FIG. 4, a plurality of counter electrodes 26 on the blanking plate 204 may be grouped into a plurality of groups, and one control circuit 43 may be arranged for each group.

Figure 17:
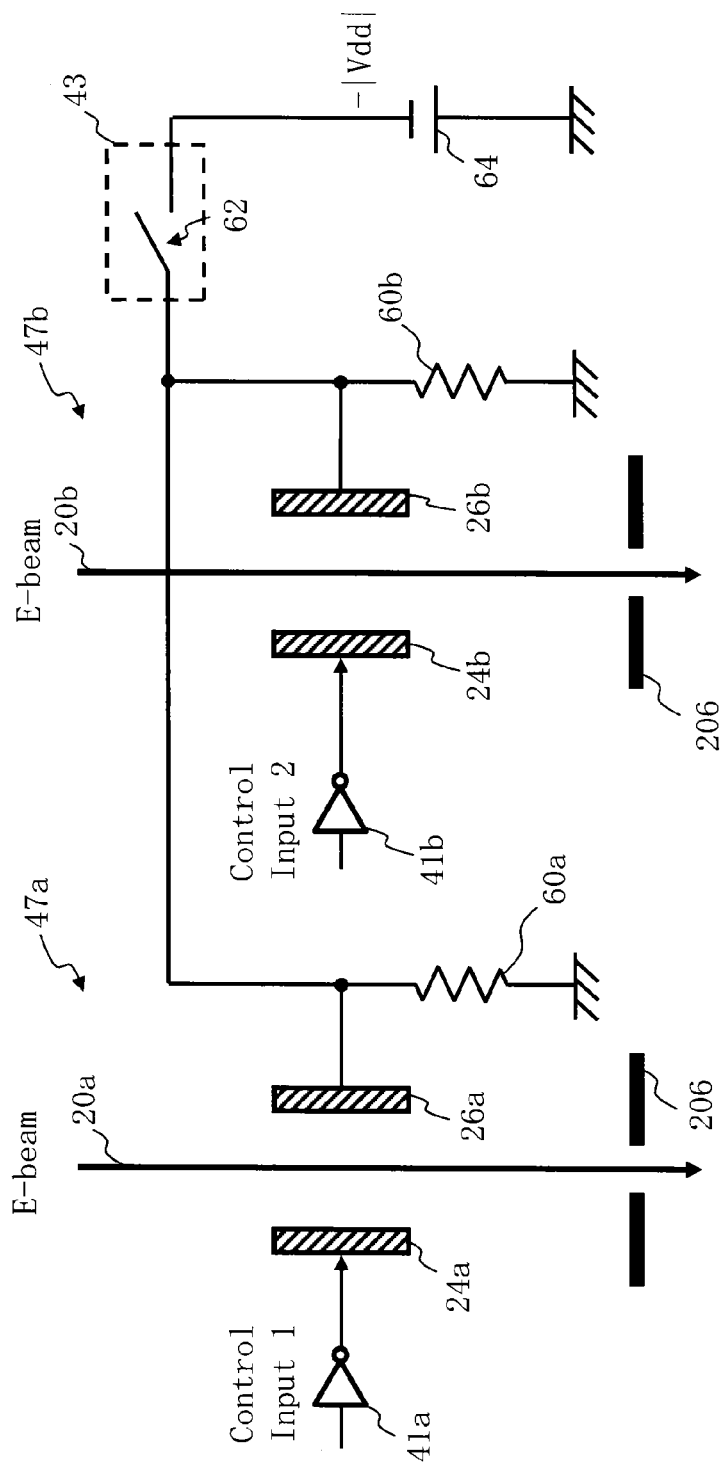
FIG. 17 shows an example of a structure in which one cancellation circuit is arranged for a plurality of separate blanking systems according to the second embodiment.

FIG. 17 shows an example of a structure in which one cancellation circuit is arranged for a plurality of separate blanking systems according to the second embodiment. As an example, FIG. 17 shows the case in which one control circuit 43 (cancellation circuit) is arranged for two separate blanking systems 47a and 47b. In the separate blanking system 47a, a counter electrode 26a is connected to a pull-down resistor 60a and the control circuit 43. Similarly, in the separate blanking system 47b, a counter electrode 26b is connected to a pull-down resistor 60b and the control circuit 43. As described above, the switch 62 is arranged in the control circuit 43, and a negative potential (−|Vdd|) is applied to the switch 62. By turning ON (closed) the switch 62, electric potentials of the counter electrodes 26a and 26b can simultaneously be negative potentials (−|Vdd|). Therefore, when both the control electrodes 24a and 24b are always fixed to ground potentials, their beam ON states can be changed into beam OFF states at the same time. Even when one of the control electrodes 24a and 24b (e.g., control electrode 24a) is always fixed to a ground potential, in case that the other one (e.g., control electrode 24b) can perform the usual blanking control, the other one concerned can also be made to be OFF.

Figure 18:
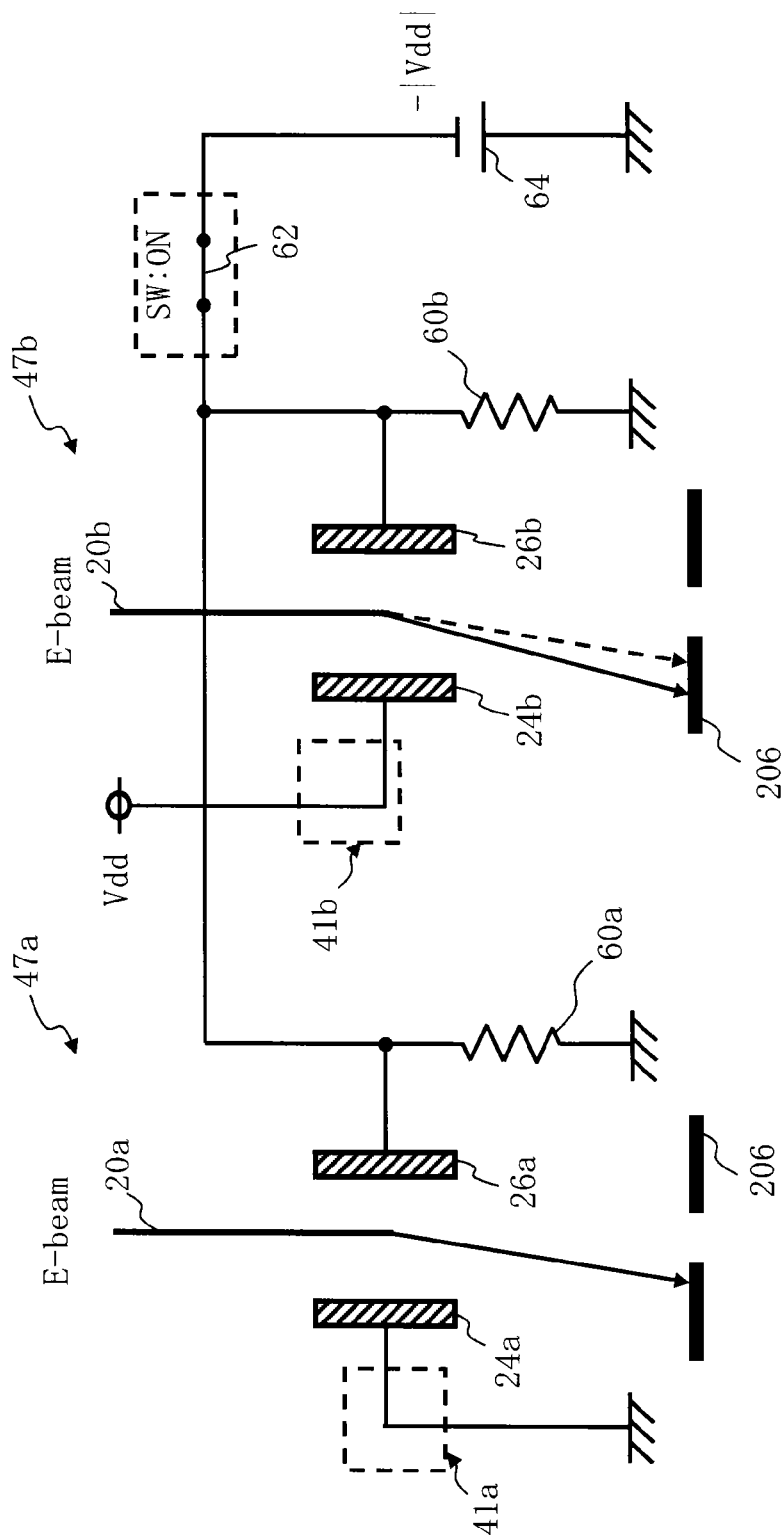
FIG. 18 shows an example of a usage state of a structure in which one cancellation circuit is arranged for a plurality of separate blanking systems according to the second embodiment.

FIG. 18 shows an example of a usage state of a structure in which one cancellation circuit is arranged for a plurality of separate blanking systems according to the second embodiment. When one or both of the control electrodes 24a and 24b is always fixed to a positive potential (Vdd) by some malfunction, in the structure according to the first embodiment, since the counter electrode 26 becomes the same positive potential (Vdd), no potential difference occurs, and thus, it is changed into the beam ON state. By contrast, according to the second embodiment, since it is possible to let the counter electrode 26 a negative potential (−|Vdd|)

which is opposite to the sign of the control electrode 24, the constant beam OFF can be maintained.

As described above, according to the second embodiment, even when the defective separate blanking system 21 being always fixed to beam ON exists, it is possible to convert the state of being always fixed to beam ON to the state of being always fixed to beam OFF by applying a voltage to the counter electrode 26 of the defective separate blanking system 21 by using the cancellation circuit (control circuit 43). Furthermore, according to the second embodiment, even when the control electrode 24 is always fixed to a positive potential (Vdd), it is possible to make the beam OFF.

Third Embodiment

In the first and second embodiments, it is difficult to perform controlling when the electric potential of the control electrode 24 goes into a floating state. Then, in the third embodiment, there will be described a configuration that deals with a case, by a simple method, where the electric potential of the control electrode 24 goes into a floating state. The configuration of the writing apparatus 100 is the same as that of FIG. 1. The contents of the present embodiment may be the same as those of the first embodiment except what is described below.

Figure 19:
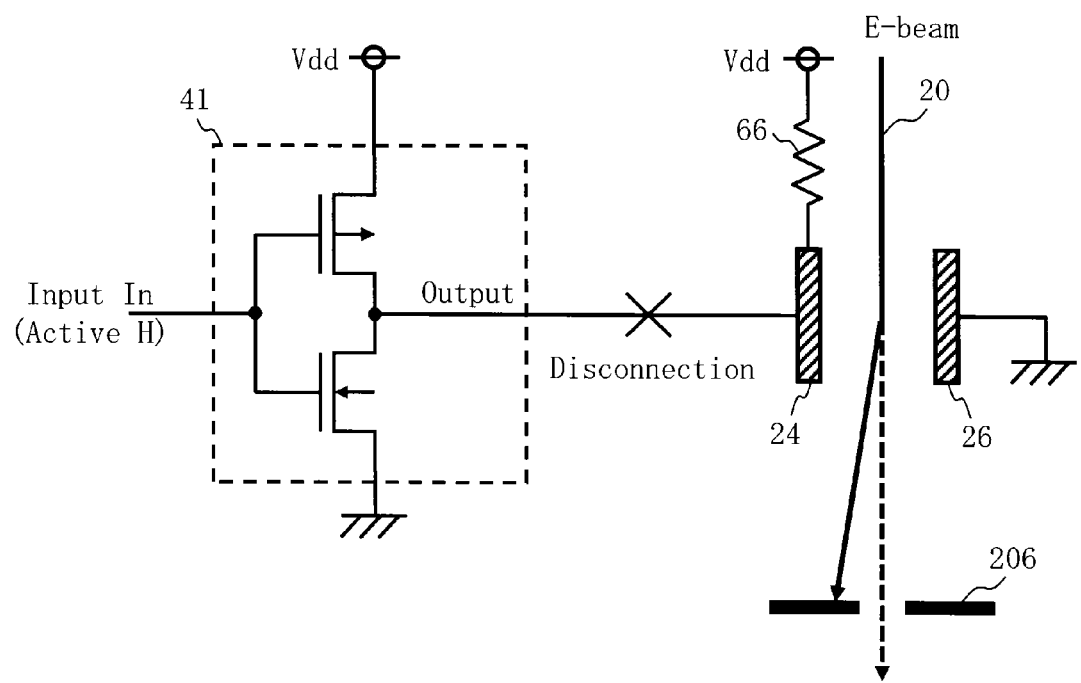
FIG. 19 shows an example of a separate blanking system according to a third embodiment.

FIG. 19 shows an example of a separate blanking system according to the third embodiment. In FIG. 19, the structure of the control circuit 41 of the separate blanking system 47 is the same as that of FIG. 7 or 8. Similarly to the description of FIG. 8, although only the CMOS inverter circuit is shown in the control circuit 41, it goes without saying that unillustrated circuits for transmitting data or inputting a signal into the CMOS inverter circuit, and like are arranged. Similarly to FIG. 7, the counter electrode 26 is directly grounded. The control circuit 43 is not arranged. The control electrode 24 is connected to the control circuit 41 and one of both the terminals of the pull-up resistor 66. The other terminal of the pull-up resistor 66 is applied with a positive potential (Vdd). As the power source having the positive potential (Vdd), the power source having an electric potential applied to the CMOS inverter circuit of the control circuit 41 may be used. However, it is not limited thereto, and another power source having a positive potential may also be prepared. The resistance value of the pull-up resistor 66 is set to a sufficiently high value. For example, the resistance value is preferably greater than or equal to several tens of kΩ, and more preferably greater than or equal to 100 kΩ. Thereby, even when the output electric potential of the control circuit 41 is a ground potential, the electric power consumed by the pull-up resistor 66 can be small or substantially disregarded.

In this structure, when in the usual state (line connected to the control electrode 24, and the control circuit 41 are in a no-failure state) in which the electric potential of the control electrode 24 can be controlled to be alternatively selectively switched between a positive potential (Vdd) and a ground potential by the control circuit 41, the electric potential of the control electrode 24 can substantially be the output electric potential from the control circuit 41 even if a positive potential (Vdd) is applied to the pull-up resistor 66. On the other hand, even when a disconnection, etc. occur between the control circuit 41 and the control electrodes 24, the control electrode 24 does not go into a floating state, and the electric potential can be made to be a positive potential (Vdd) through the pull-up resistor 66. Thereby, even using the defective separate blanking system 21 which cannot be controlled by the control circuit 41, a beam OFF state can be obtained by deflecting a corresponding beam toward the control electrode 24, which is the same direction as that of the usual blanking deflection, to irradiate the limiting aperture member 206 by the beam.

Fourth Embodiment

In the first embodiment, it is difficult to perform controlling when the electric potential of the control electrode 24 goes into a floating state. Although the third embodiment is applicable to the case of a floating state due to disconnection, etc. between the control electrode 24 and the control circuit 41, it cannot cope with the case where the electric potential of the control electrode 24 is always fixed to a ground potential of beam ON. The fourth embodiment will describe a configuration combining the first and third embodiments. The structure of the writing apparatus 100 is the same as that of FIG. 1. The contents of the present embodiment may be the same as those of the first or third embodiment except what is described below.

Figure 20:
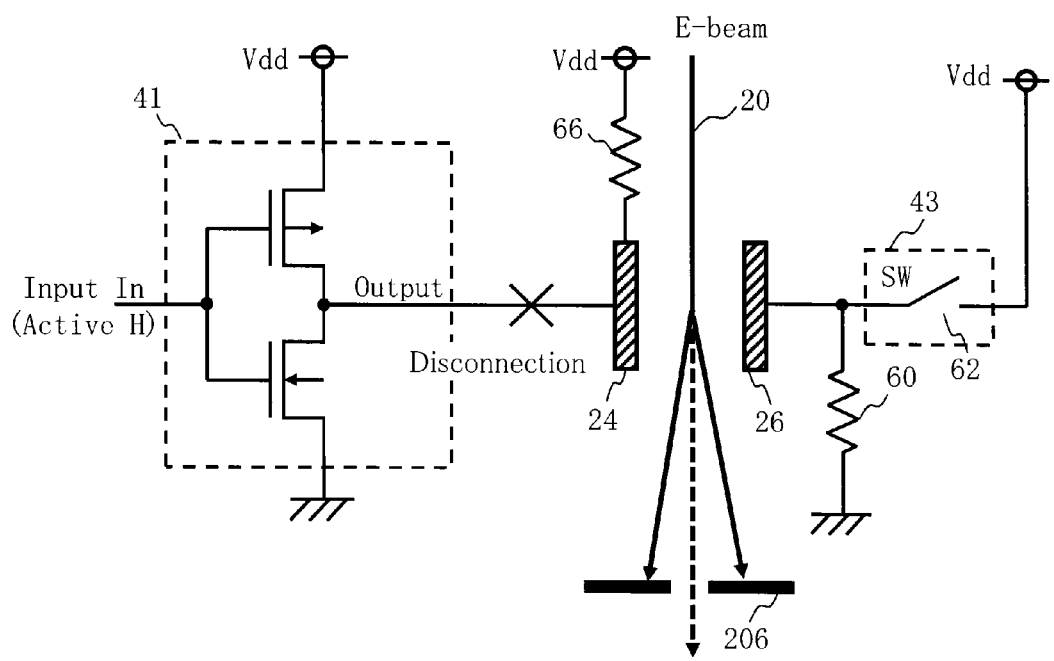
FIG. 20 shows an example of a separate blanking system according to a fourth embodiment.

FIG. 20 shows an example of a separate blanking system according to the fourth embodiment. In FIG. 20, the structure of the control circuit 41 of the separate blanking system 47 is the same as that of FIG. 7 or 8. Similarly to the description of FIG. 8, although only the CMOS inverter circuit is shown in the control circuit 41, it goes without saying that unillustrated circuits for transmitting data or inputting a signal into the CMOS inverter circuit, and like are arranged. The control electrode 24 is connected to the control circuit 41 and one of both the terminals of the pull-up resistor 66. The other terminal of the pull-up resistor 66 is applied with a positive potential (Vdd). As the power source having the positive potential (Vdd), the power source having an electric potential applied to the CMOS inverter circuit of the control circuit 41 may be used. However, it is not limited thereto, and another power source having a positive potential may also be prepared. The resistance value of the pull-up resistor 66 is set to a sufficiently high value. For example, the resistance value is preferably greater than or equal to several tens of kΩ, and more preferably greater than or equal to 100 kΩ. Thereby, the electric power consumed by the pull-up resistor 66 can be small or substantially disregarded.

In FIG. 20, the counter electrode 26 is grounded through the pull-down resistor 60, and connected to the control circuit 43. The switch 62 (cancellation switch) is arranged in the control circuit 43. One of both the terminals of the switch 62 is connected to the counter electrode 26, and the other one is applied with a positive potential (Vdd). As the power source having the positive potential (Vdd), the power source having an electric potential applied to the CMOS inverter circuit of the control circuit 41 may be used. However, it is not limited thereto, and another power source having a positive potential may also be prepared. The resistance value of the pull-down resistor 60 is set to a sufficiently high value. For example, the resistance value is preferably greater than or equal to several tens of kΩ, and more preferably greater than or equal to 100 kΩ. Thereby, the electric power consumed by the pull-down resistor 60 when the switch 62 is turned ON (closed) can be small or substantially disregarded.

In this structure, the switch 62 is made to be OFF (open) when in the usual state (line connected to the control electrode 24 and the control circuit 41 are in a no-failure state) in which the electric potential of the control electrode 24 can be controlled to be alternatively selectively switched between a positive potential (Vdd) and a ground potential by the control circuit 41. Thereby, the electric potential of the counter electrode 26 becomes a ground potential in spite of there being the pull-down resistor 60 because the current does not flow, and thus, the usual separate blanking control can be performed. Moreover, in spite of there being the pull-up resistor 66, the electric potential of the control electrode 24 can be controlled to be the output electric potential of the control circuit 41.

On the other hand, when the electric potential of the control electrode 24 is always fixed to a ground potential, the switch 62 is made to be ON (closed). Thereby, since the electric potential of the counter electrode 26 substantially becomes a positive potential (Vdd), a beam OFF state can be obtained by deflecting a corresponding beam toward the counter electrode 26, which is opposite to the direction of the usual blanking deflection, to irradiate the limiting aperture member 206 by the beam. In other words, when the electric potential of the control electrode 24 (first electrode) is fixed to a ground potential, the control circuit 43 (electric potential change mechanism) changes the potential of the counter electrode 26 (second electrode), which is grounded, to a positive potential from the ground potential.

Furthermore, when the state between the control circuit 41 and the control electrodes 24 becomes a floating state due to disconnection, etc., the switch 62 is turned OFF (open). Thereby, the electric potential of the control electrode 24 can be made to be a positive potential (Vdd) through the pull-up resistor 66. On the other hand, the electric potential of the counter electrode 26 can be maintained to be a ground potential. Thereby, even using the defective separate blanking system 21 which cannot be controlled by the control circuit 41, a beam OFF state can be obtained by deflecting a corresponding beam toward the control electrode 24, which is the same direction as that of the usual blanking deflection, to irradiate the limiting aperture member 206 by the beam.

Although FIG. 20 shows a separate blanking system for one beam in the multi-beams, other separate blanking systems for remaining beams have the same configuration. While the control circuit 43 (cancellation circuit) may be arranged for each separate blanking system, it is not limited thereto. As shown in FIG. 4, a plurality of counter electrodes 26 on the blanking plate 204 may be grouped into a plurality of groups, and one control circuit 43 may be arranged for each group.

Figure 21:
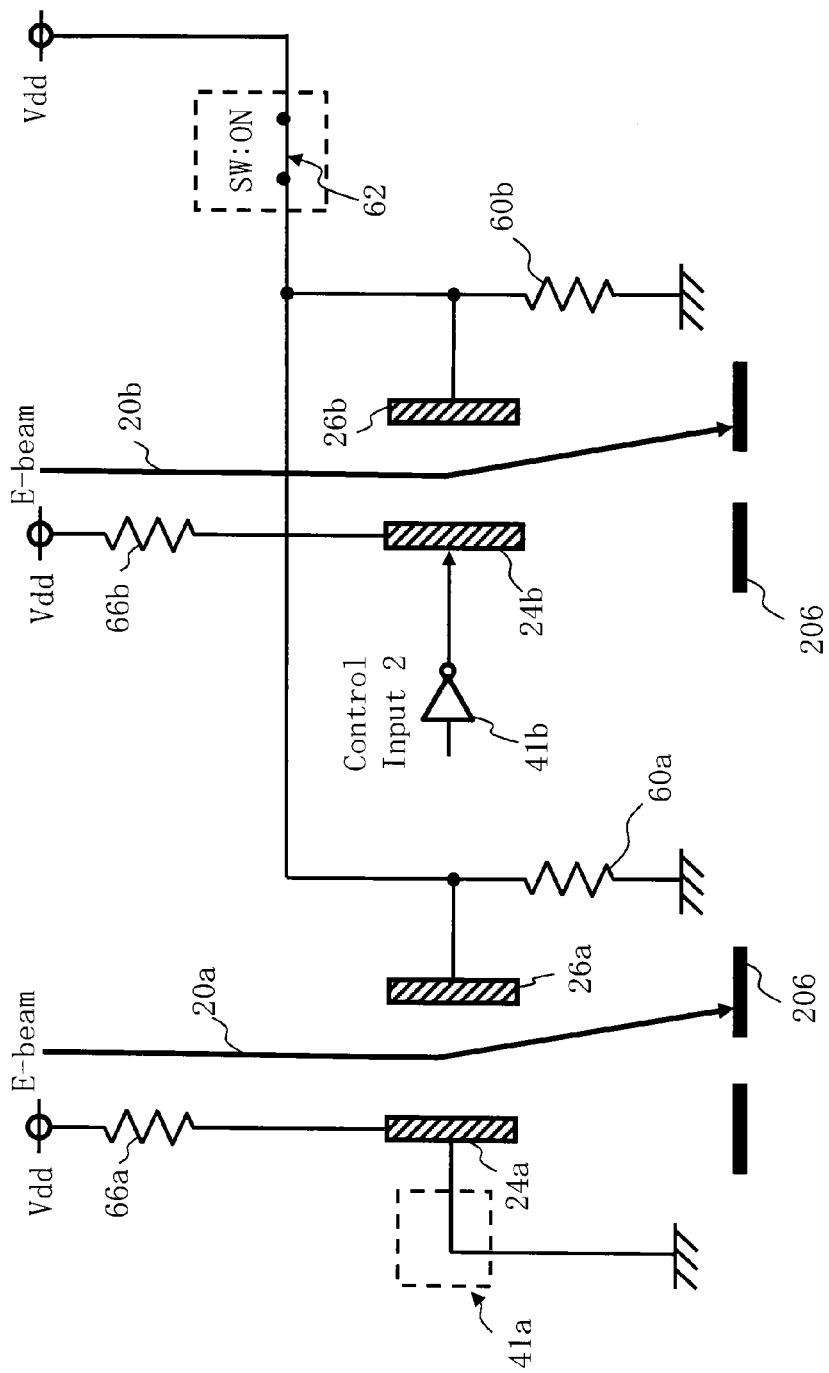
FIG. 21 shows an example of a structure in which one cancellation circuit is arranged for a plurality of separate blanking systems according to the fourth embodiment.

FIG. 21 shows an example of a structure in which one cancellation circuit is arranged for a plurality of separate blanking systems according to the fourth embodiment. As an example, FIG. 21 shows the case in which one control circuit 43 (cancellation circuit) is arranged for two separate blanking systems 47a and 47b. In the separate blanking system 47a, a control electrode 24a is connected to a control circuit 41a and a pull-up resistor 66a, and the pull-up resistor 66a is applied with a positive potential (Vdd). A counter electrode 26a is connected to a pull-down resistor 60a and the control circuit 43. Similarly, in the separate blanking system 47b, a control electrode 24b is connected to a control circuit 41b and a pull-up resistor 66b, and the pull-up resistor 66b is applied with a positive potential (Vdd). A counter electrode 26b is connected to a pull-down resistor 60b and the control circuit 43. In other words, the control circuit 43 is connected to the counter electrodes 26a and 26b. As described above, the switch 62 is arranged in the control circuit 43, and a positive potential (Vdd) is applied to the switch 62. By turning ON (closed) the switch 62, electric potentials of the counter electrodes 26a and 26b can simultaneously be positive potentials (Vdd). Therefore, when both the control electrodes 24a and 24b are always fixed to ground potentials, their beam ON states can be changed into beam OFF states at the same time. Even when one of the control electrodes 24a and 24b (e.g., control electrode 24a) is always fixed to a ground potential, it is possible to also make a beam OFF state of the other one (e.g., control electrode 24b) by performing a blanking control so that the other one concerned may be beam ON to have a ground potential. Furthermore, as described above, even when a disconnection occurs in the input line of one or both of the control electrodes 24a and 24b, since one or both of them become Vdd electric potentials without going into a floating state due to the pull-up resistors 66a and 66b, beams for the control electrode 24 can be beam OFF by turning OFF (open) the switch 62.

As described above, according to the fourth embodiment, even when the defective separate blanking system 21 being always fixed to beam ON exists, it is possible to convert the state of being always fixed to beam ON to the state of being always fixed to beam OFF by applying a voltage to the counter electrode 26 of the defective separate blanking system 21 by using the cancellation circuit (control circuit 43). Furthermore, even when a disconnection occurs between the control circuit 41 and the control electrodes 24, a beam OFF state can be obtained by turning off the cancellation circuit (control circuit 43), that is, turning off the switch 62.

Fifth Embodiment

Although, in the first, second and fourth embodiments, there has been described a structure in which it is switched between applying one type of an electric potential to the counter electrode 26 and not applying it at all, it is not limited thereto. In the fifth embodiment, there will be described a structure in which two types of different electric potentials are switchably applied to the counter electrode 26. The configuration of the writing apparatus 100 is the same as that of FIG. 1. The contents of the present embodiment may be the same as those of the first embodiment except what is described below.

Figure 22:
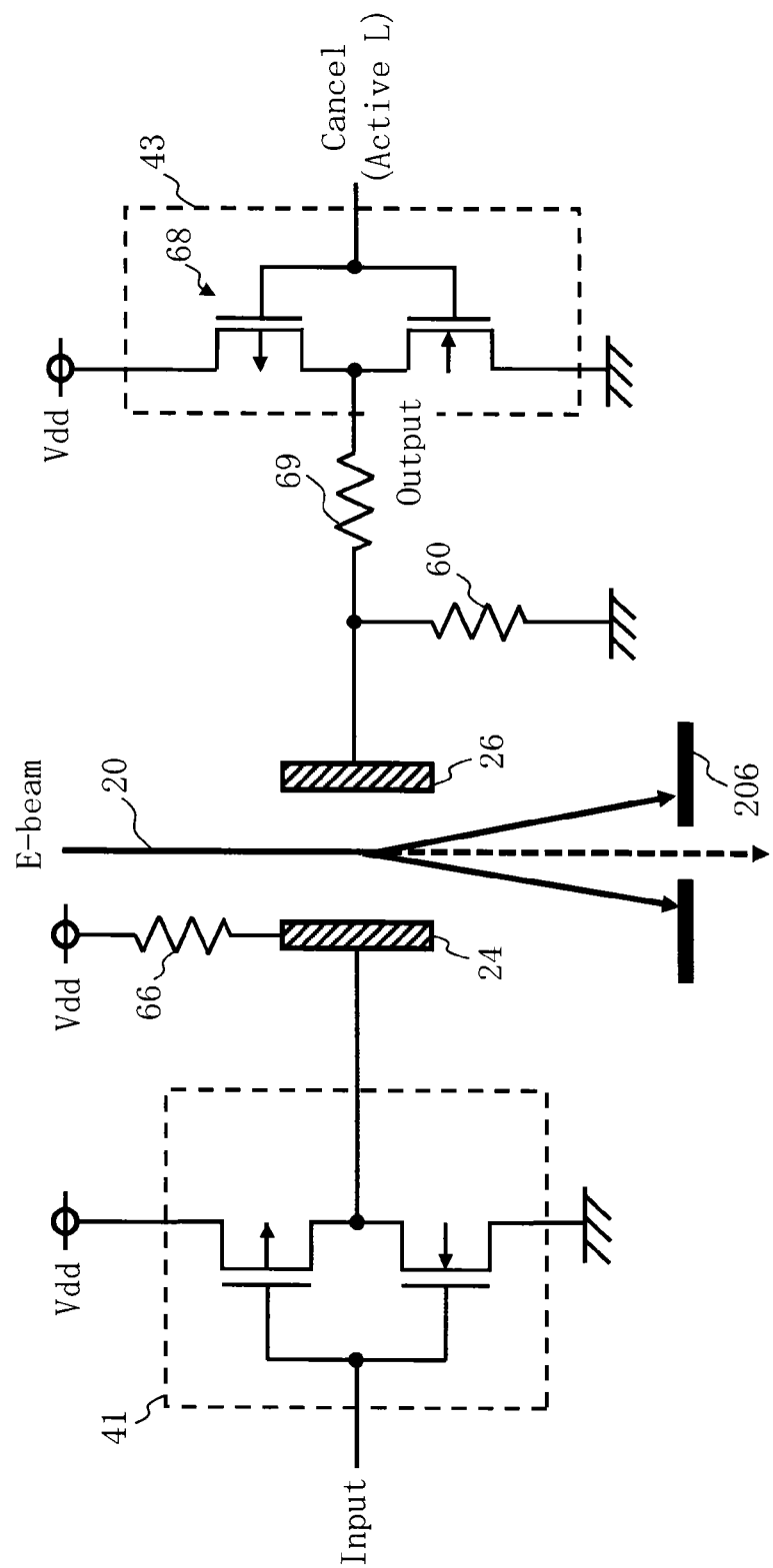
FIG. 22 shows an example of a separate blanking system according to a fifth embodiment.

FIG. 22 shows an example of a separate blanking system according to the fifth embodiment. In FIG. 22, the structure of the control circuit 41 of the separate blanking system 47 is the same as that of FIG. 7 or 8. Similarly to the description of FIG. 8, although only the CMOS inverter circuit is shown in the control circuit 41, it goes without saying that unillustrated circuits for transmitting data or inputting a signal into the CMOS inverter circuit, and like are arranged. With respect to the control electrode 24, the control circuit 41 and one of both the terminals of the pull-up resistor 66 are connected. The other terminal of the pull-up resistor 66 is applied with a positive potential (Vdd). As the power source having the positive potential (Vdd), the power source having an electric potential applied to the CMOS inverter circuit of the control circuit 41 may be used. However, it is not limited thereto, and another power source having a positive potential may also be prepared. The resistance value of the pull-up resistor 66 is set to a sufficiently high value. For example, the resistance value is preferably greater than or equal to several tens of kΩ, and more preferably greater than or equal to 100 kΩ. Thereby, the electric power consumed by the pull-up resistor 66 can be small or substantially disregarded.

In FIG. 22, one of both the terminals of the pull-down resistor 60 and that of a protective resistor 69 are connected to the counter electrode 26, and the output terminal of the control circuit 43 is connected to the other of the terminals of the protective resistor 69. The resistance value of the protective resistor 69 is set to a sufficiently low value. When a short circuit occurs between the control electrode 24 and the counter electrode 26, the inverter circuit of the control circuit 41 and the inverter circuit, to be described later, of the control circuit 43 can be protected by the protective resistor 69. In addition, the protective register 69 prevents an electron, scattered by the aperture member 203 on the blanking plate 204 and intruded through the counter electrode 26, from damaging the inverter circuit of the control circuit 43. Since the protective resistor 69 is usually inserted in the circuit which has no resistance (in order to reduce a time constant $\tau=CR$ due to a stray capacitance C of the circuit), it is desirable to make the resistance value of the protective resistor 69 as low as possible. Considering a voltage division ratio between the protective resistor 69 and the pull-down resistor 60, the resistance value of the protective resistor 69 is preferably lower than or equal to several hundreds of $\Omega$, and more preferably lower than or equal to several tens of $\Omega$, for example.

In the control circuit 43, a CMOS (complementary MOS) inverter circuit 68 is arranged. The CMOS inverter circuit 68 is connected to a positive potential Vdd and a ground potential. As the power source having a positive potential (Vdd), the power source having an electric potential applied to the CMOS inverter circuit of the control circuit 41 may be used. However, it is not limited thereto, and another power source having a positive potential may also be prepared.

In the control circuit 43, the output line (OUT) of the CMOS inverter circuit 68 is connected to the counter electrode 26 through the protective resistor 69. As the input (IN) of the CMOS inverter circuit 68, either a L (low) electric potential (e.g., ground potential) lower than a threshold voltage, or a H (high) electric potential higher than or equal to the threshold voltage is applied serving as a control signal. According to the fifth embodiment, in the state where an H electric potential is applied to the input (IN) of the CMOS inverter circuit, the output (OUT) of the CMOS inverter circuit becomes a ground potential, and the potential of the counter electrode 26 becomes a ground potential in spite of there being the pull-down resistor 60 and the protective resistor 69 because the current does not flow. Therefore, when the potential of the control electrode 24 is a positive potential (Vdd), it is controlled to be beam OFF by deflecting a corresponding beam 20 by a potential difference and performing blocking using the limiting aperture member 206. When the potential of the control electrode 24 is a ground potential, since there is no potential difference, a corresponding beam 20 is not deflected. Therefore, it is controlled to be beam ON by letting beams pass through the limiting aperture member 206. Accordingly, when in normal use without any problems, an H electric potential is applied to the input (IN) of the CMOS inverter circuit.

On the other hand, when the electric potential of the control electrode 24 is always fixed to a ground potential, an L electric potential (active electric potential) is applied to the input (IN) of the CMOS inverter circuit 68. Thereby, since the electric potential of the counter electrode 26 substantially becomes a positive potential (Vdd), a beam OFF state can be obtained by deflecting a corresponding beam toward the counter electrode 26, which is opposite to the direction of the usual blanking deflection, to irradiate the limiting aperture member 206 by the beam. In other words, when the electric potential of the control electrode 24 (first electrode) is fixed to a ground potential, the control circuit 43 (electric potential change mechanism) changes the potential of the counter electrode 26 (second electrode), which is grounded, to a positive potential from the ground potential. Thus, the CMOS inverter circuit 68 (one example of second potential applying mechanism) in the control circuit 43 (electric potential change mechanism) alternatively selectively applies two different electric potentials (Vdd, and ground potential) including a positive potential to the counter electrode 26 (second electrode).

Furthermore, if a disconnection occurs between the control circuit 41 and the control electrodes 24, it becomes possible to make the potential of the control electrode 24 a positive potential (Vdd) through the pull-up resistor 66. Then, an H electric potential is applied to the input (IN) of the CMOS inverter circuit 68. Thereby, it becomes possible to make the potential of the counter electrode 26 a ground potential. Therefore, even using the defective separate blanking system 21 which cannot be controlled by the control circuit 41, a beam OFF state can be obtained by deflecting a corresponding beam toward the control electrode 24, which is the same direction as that of the usual blanking deflection, to irradiate the limiting aperture member 206 by the beam. On the other hand, if a disconnection occurs between the control circuit 43 and the counter electrodes 26, it becomes possible to make the potential of the counter electrode 26 a ground potential through the pull-down resistor 60. Therefore, unless failures occur between the control circuit 41 and the control electrode 24, it is also possible to use the blanking plate 204 as it is.

Although FIG. 22 shows a separate blanking system for one beam in the multi-beams, other separate blanking systems for remaining beams have the same configuration. While the control circuit 43 (cancellation circuit) may be arranged for each separate blanking system, it is not limited thereto. As explained referring to FIG. 4, a plurality of counter electrodes 26 on the blanking plate 204 may be grouped into a plurality of groups, and one control circuit 43 may be arranged for each of the groups.

Figure 23:
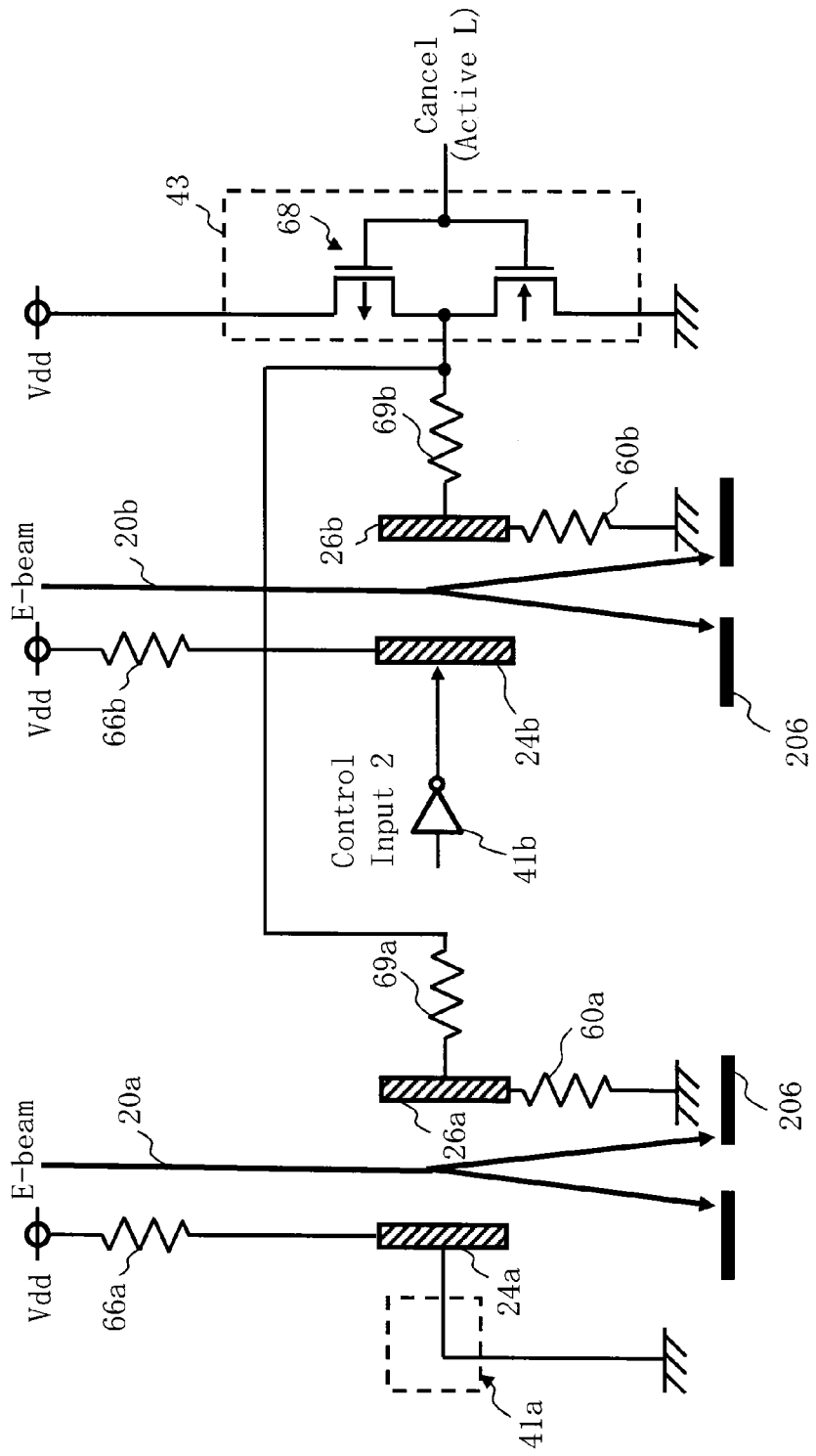
FIG. 23 shows an example of a structure in which one cancellation circuit is arranged for a plurality of separate blanking systems according to the fifth embodiment.

FIG. 23 shows an example of a structure in which one cancellation circuit is arranged for a plurality of separate blanking systems according to the fifth embodiment. As an example, FIG. 23 shows the case in which one control circuit 43 (cancellation circuit) is arranged for two separate blanking systems 47a and 47b. In the separate blanking system 47a, a control circuit 41a and a pull-up resistor 66a are connected to a control electrode 24a, and the pull-up resistor 66a is applied with a positive potential (Vdd). A pull-down resistor 60a, which is grounded, and a protective resistor 69a are connected to a counter electrode 26a. Similarly, in the separate blanking system 47b, a control circuit 41b and a pull-up resistor 66b are connected to a control electrode 24b, and the pull-up resistor 66b is applied with a positive potential (Vdd). A pull-down resistor 60b, which is grounded, and a protective resistor 69b are connected to a counter electrode 26b. The protective resistors 69a and 69b are connected to the control circuit 43. In other words, the control circuit 43 is connected to the counter electrodes 26a and 26b respectively through the protective resistors 69a and 69b. By applying an L electric potential (active potential) to the input (IN) of the CMOS inverter circuit 68 in the control circuit 43, electric potentials of the counter electrodes 26a and 26b can simultaneously be positive potentials (Vdd). Therefore, when both the control electrodes 24a and 24b are always fixed to ground potentials, their beam ON states can be changed into beam OFF states at the same time.

Even when one of the control electrodes 24a and 24b (e.g., control electrode 24a) is always fixed to a ground potential, it is possible to also make a beam OFF state of the other one (e.g., control electrode 24b) by performing a blanking control so that the other one concerned may be beam ON to have a ground potential. Furthermore, as described above, when the signal line of one or both of the control electrodes 24a and 24b becomes an open state, beams to the control electrode 24 can be beam OFF by applying an H electric potential to the input (IN) of the CMOS inverter circuit 68.

As described above, the blanking plate 204 (blanking device) of the fifth embodiment includes a plurality of control electrodes 24 (first electrode), a plurality of control circuits 41 (first potential applying mechanism), a plurality of counter electrodes 26 (second electrode), and a plurality of control circuits 43 (electric potential change mechanism). The blanking plate 204 further includes a plurality of pull-down resistors 60, a plurality of pull-up resistors 66, and a plurality of protective resistors 69. Each of a plurality of control circuits 41 alternatively selectively applies two different electric potentials, for blanking control, for switching a corresponding beam 20 of the multi-beams 20 (multi charged particle beam) between a beam ON state and a beam OFF state, to a corresponding one of a plurality of control electrodes 24. Each of a plurality of counter electrodes 26, which is grounded and paired with a corresponding one of a plurality of of the control electrodes 24, provides a blanking deflection of a corresponding beam 20. Each of a plurality of pull-down resistors 60 is arranged between a corresponding one of a plurality of counter electrodes 26 and the ground. One of both the terminals of each of a plurality of pull-up resistors 66 is connected to a corresponding one a plurality of control electrodes 24, and the other terminal is applied with a positive potential. Each of a plurality of protective resistors 69 (one example of first resistor) is arranged between a corresponding one of a plurality of control circuits 43 and a counter electrode 26 corresponding to each of a plurality of control circuits 43. Each of a plurality of control circuits 43 includes the CMOS inverter circuit 68 (one example of second potential applying mechanism) which alternatively selectively applies two different potentials including a positive potential to a corresponding one of a plurality of counter electrodes 26. When the electric potential of a corresponding one of a plurality of control electrodes 24 is fixed to a ground potential, each of a plurality of control circuits 43 changes the electric potential of a corresponding one of a plurality of grounded counter electrodes 26 from one (ground potential) of the two different potentials to the other one (Vdd).

As described above, according to the fifth embodiment, even when the defective separate blanking system 21 being always fixed to beam ON exists, it is possible to convert the state of being always fixed to beam ON to the state of being always fixed to beam OFF by applying one of the two different type switchable potentials to the counter electrode 26 of the defective separate blanking system 21 by using the cancellation circuit (control circuit 43). Furthermore, even when an open state occurs between the control circuit 41 and the control electrodes 24, a beam OFF state can be obtained by applying the other one of the two different potentials to the counter electrode 26 by using the cancellation circuit (control circuit 43). Moreover, even if a short (short circuit) occurs between the control electrode 24 and the counter electrode 26, failures of the CMOS inverter circuits in the control circuits 41 and 43 can be avoided by the corresponding protective resistor 69.

Sixth Embodiment

In the fifth embodiment, while there has been described an example of a structure in which two types of different electric potentials including a positive potential are switchably applied to the counter electrode 26, it is not limited thereto. In the sixth embodiment, another example will be described. The configuration of the writing apparatus 100 is the same as that of FIG. 1. The contents of the present embodiment may be the same as those of the first or fifth embodiment except what is described below.

Figure 24:
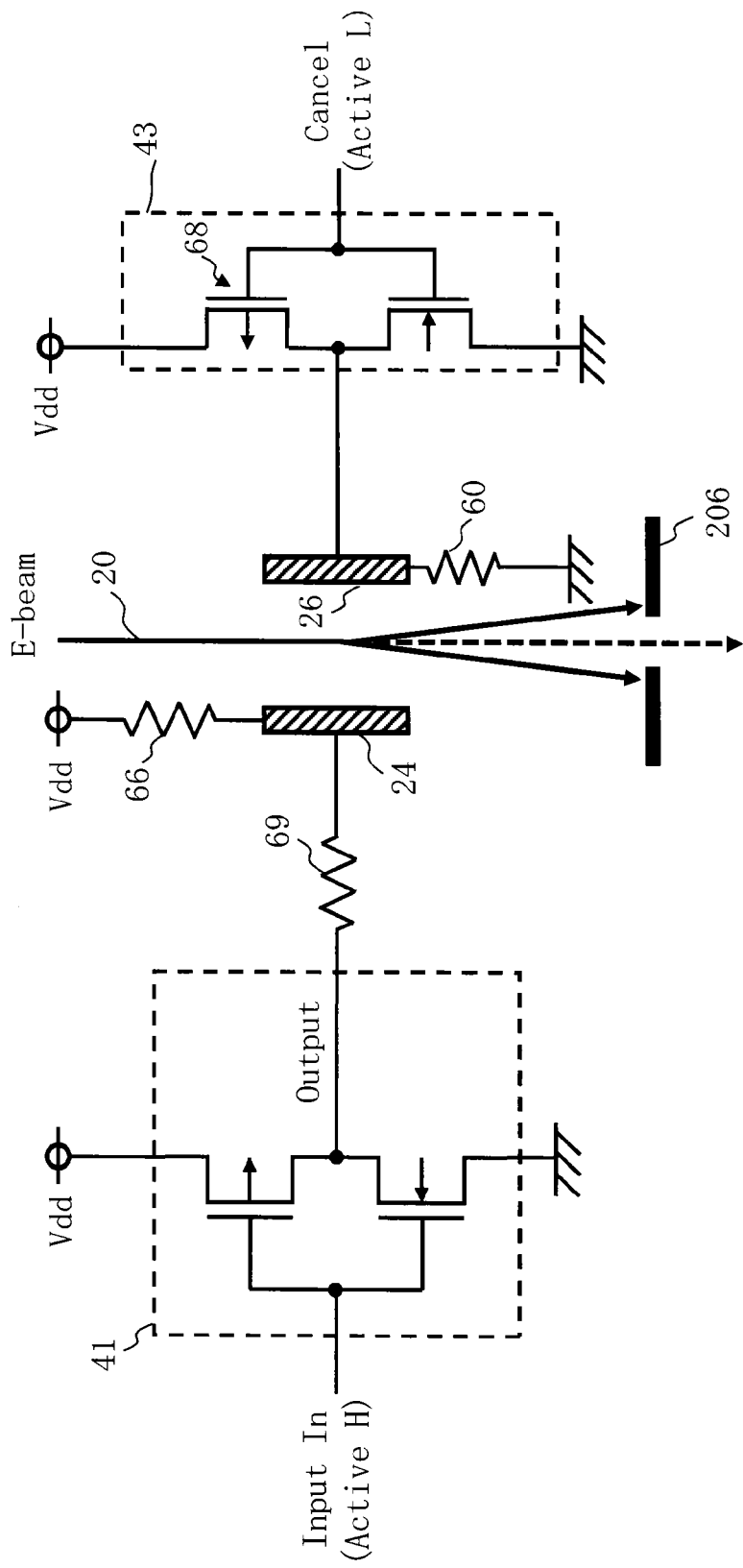
FIG. 24 shows an example of a separate blanking system according to a sixth embodiment.

FIG. 24 shows an example of a separate blanking system according to the sixth embodiment. FIG. 24 is the same as FIG. 22 except that the arrangement position of the protective resistor 69 has been changed to the control electrode 24 side from the counter electrode 26 side. That is, in FIG. 24, the control electrode 24 is connected to the pull-up resistor 66 and one of both the terminals of the protective resistor 69, and the other of the terminals of the protective resistor 69 is connected to the output terminal of the control circuit 41. The resistance value of the protective resistor 69 is set to a sufficiently low value. When a short circuit occurs between the control electrode 24 and the counter electrode 26, the inverter circuit of the control circuit 41 and the inverter circuit 68 of the control circuit 43 can be protected by the protective resistor 69. In addition, the protective register 69 prevents an electron, scattered by the aperture member 203 on the blanking plate 204 and intruded through the control electrode 24, from damaging the inverter circuit of the control circuit 41. Since the protective resistor 69 is usually inserted in the circuit which has no resistance (in order to reduce a time constant $\tau=CR$ due to a stray capacitance C of the circuit), it is desirable to make the resistance value of the protective resistor 69 as low as possible. Considering a voltage division ratio between the protective resistor 69 and the pull-up resistor 66, the resistance value of the protective resistor 69 is preferably lower than or equal to several hundreds of $\Omega$, and more preferably lower than or equal to several tens of $\Omega$, for example. On the other hand, the counter electrode 26 is connected to the pull-down resistor 60 and the output terminal of the control circuit 43.

Similarly to FIG. 22, the CMOS inverter circuit 68 is arranged in the control circuit 43. According to the sixth embodiment, in the state where an H electric potential is applied to the input (IN) of the CMOS inverter circuit, the output (OUT) of the CMOS inverter circuit becomes a ground potential, and the potential of the counter electrode 26 becomes a ground potential in spite of there being the pull-down resistor 60. When the output of the CMOS inverter circuit of the control electrode 41 is a positive potential (Vdd), the potential of the control electrode 24 becomes a positive potential (Vdd) in spite of there being the pull-up resistor 66 and the protective resistor 69 because the current does not flow. In such a state, it is controlled to be beam OFF by deflecting a corresponding beam 20 by a potential difference between the control electrode 24 and the counter electrode 26 and performing blocking using the limiting aperture member 206. When the potential of the control electrode 24 is a ground potential, since there is no potential difference and a corresponding beam 20 is not deflected, it is controlled to be beam ON by letting beams pass through the limiting aperture member 206. Therefore, when in normal use without any problems, an H electric potential is applied to the input (IN) of the CMOS inverter circuit 68.

On the other hand, when the electric potential of the control electrode 24 is always fixed to the ground potential, an L electric potential (active electric potential) is applied to the input (IN) of the CMOS inverter circuit 68. Thereby, since the electric potential of the counter electrode 26 substantially becomes a positive potential (Vdd), a beam OFF state can be obtained by deflecting a corresponding beam toward the counter electrode 26, which is opposite to the direction of the usual blanking deflection, to irradiate the limiting aperture member 206 by the beam. In other words, when the electric potential of the control electrode 24 (first electrode) is fixed to a ground potential, the control circuit 43 (electric potential change mechanism) changes the potential of the counter electrode 26 (second electrode), which is grounded, to a positive potential from the ground potential. Thus, the CMOS inverter circuit 68 (one example of second potential applying mechanism) in the control circuit 43 (electric potential change mechanism) alternatively selectively applies two different electric potentials (Vdd, and ground potential) including a positive potential to the counter electrode 26 (second electrode).

Furthermore, if a disconnection occurs between the control circuit 41 and the control electrodes 24, it becomes possible to make the potential of the control electrode 24 a positive potential (Vdd) through the pull-up resistor 66 in order to avoid becoming a floating state. Then, an H electric potential is applied to the input (IN) of the CMOS inverter circuit 68. Thereby, it becomes possible to make the potential of the counter electrode 26 a ground potential. Therefore, even using the defective separate blanking system 21 which cannot be controlled by the control circuit 41, a beam OFF state can be obtained by deflecting a corresponding beam toward the control electrode 24, which is the same direction as that of the usual blanking deflection, to irradiate the limiting aperture member 206 by the beam. On the other hand, if a disconnection occurs between the control circuit 43 and the counter electrodes 26, it becomes possible to make the potential of the counter electrode 26 a ground potential through the pull-down resistor 60 in order to avoid becoming a floating state. Therefore, unless failures occur between the control circuit 41 and the control electrode 24, it is also possible to use the blanking plate 204 as it is.

Although FIG. 24 shows a separate blanking system for one beam in the multi-beams, other separate blanking systems for remaining beams have the same configuration. While the control circuit 43 (cancellation circuit) may be arranged for each separate blanking system, it is not limited thereto. As shown in FIG. 4, a plurality of counter electrodes 26 on the blanking plate 204 may be grouped into a plurality of groups, and one control circuit 43 may be arranged for each group.

Figure 25:
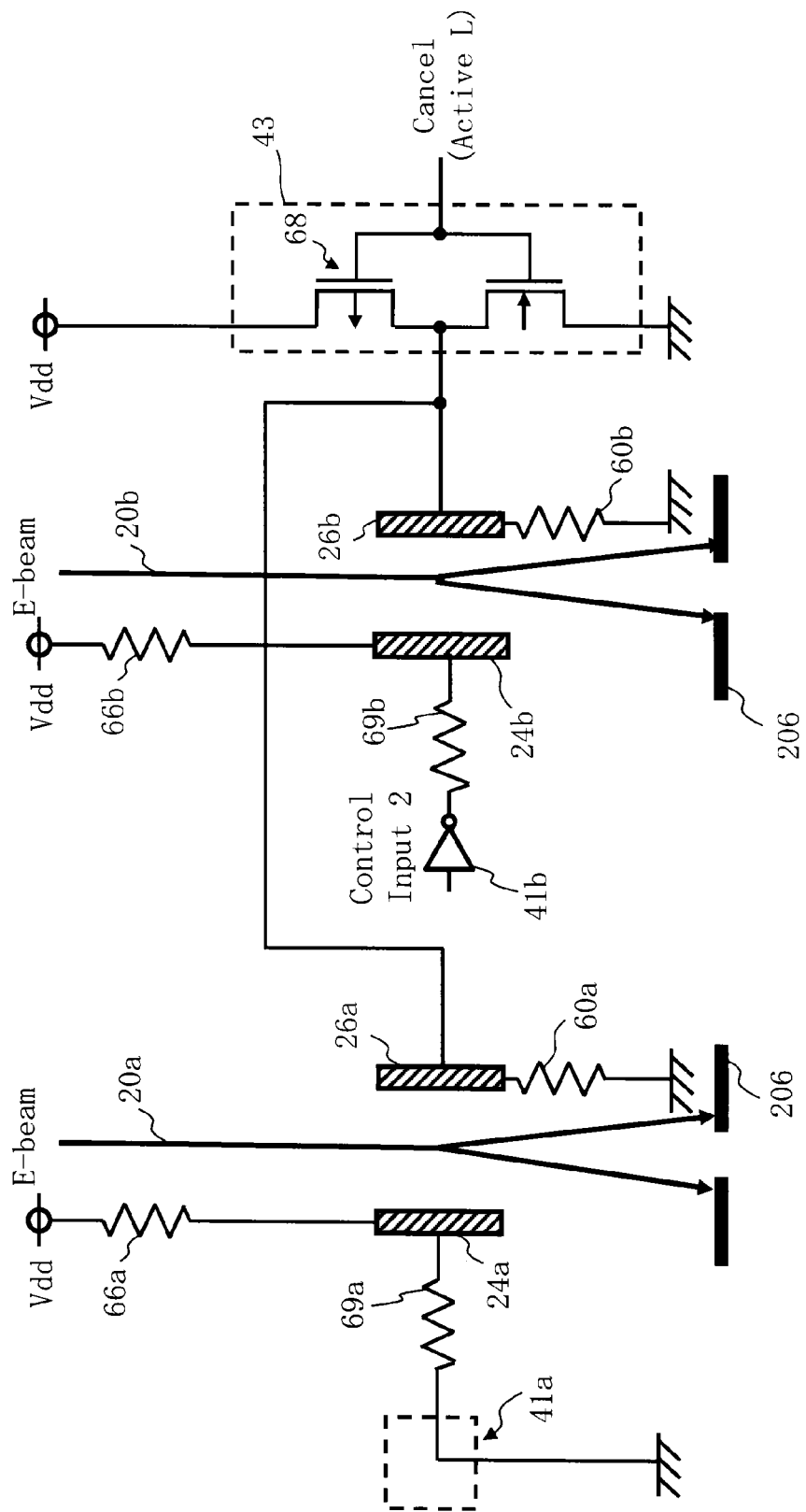
FIG. 25 shows an example of a structure in which one cancellation circuit is arranged for a plurality of separate blanking systems according to the sixth embodiment.

FIG. 25 shows an example of a structure in which one cancellation circuit is arranged for a plurality of separate blanking systems according to the sixth embodiment. As an example, FIG. 25 shows the case in which one control circuit 43 (cancellation circuit) is arranged for two separate blanking systems 47a and 47b. In the separate blanking system 47a, a control circuit 41a, through a protective resistor 69a, and a pull-up resistor 66a are connected to a control electrode 24a, and the pull-up resistor 66a is applied with a positive potential (Vdd). A pull-down resistor 60a, which is grounded, and the control circuit 43 are connected to a counter electrode 26a. Similarly, in the separate blanking system 47b, a control circuit 41b, through a protective resistor 69b, and a pull-up resistor 66b are connected to a control electrode 24b, and the pull-up resistor 66b is applied with a positive potential (Vdd). A pull-down resistor 60b, which is grounded, and the control circuit 43 are connected to a counter electrode 26b. In other words, the control circuit 43 is connected to the counter electrodes 26a and 26b. By applying an L electric potential (active potential) to the input (IN) of the CMOS inverter circuit 68 in the control circuit 43, electric potentials of the counter electrodes 26a and 26b can simultaneously be positive potentials (Vdd). Therefore, when both the control electrodes 24a and 24b are always fixed to ground potentials, their beam ON states can be changed into beam OFF states at the same time.

Even when one of the control electrodes 24a and 24b (e.g., control electrode 24a) is always fixed to a ground potential, it is possible to also make a beam OFF state of the other one (e.g., control electrode 24b) by performing a blanking control so that the other one concerned may be beam ON to have a ground potential. Furthermore, as described above, when a disconnection state occurs in one or both of the control electrodes 24a and 24b, beams to the control electrode 24 can be beam OFF by applying an H electric potential to the input (IN) of the CMOS inverter circuit 68.

As described above, the blanking plate 204 (blanking device) of the sixth embodiment, similarly to the fifth embodiment, includes a plurality of control electrodes 24 (first electrode), a plurality of control circuits 41 (first potential applying mechanism), a plurality of counter electrodes 26 (second electrode), and a plurality of control circuits 43 (electric potential change mechanism). The blanking plate 204 further includes a plurality of pull-down resistors 60, a plurality of pull-up resistors 66, and a plurality of protective resistors 69. Each of a plurality of control circuits 41 alternatively selectively applies two different electric potentials, for blanking control, for switching a corresponding beam 20 of the multi-beams 20 (multi charged particle beam) between a beam ON state and a beam OFF state, to a corresponding one of a plurality of control electrodes 24. Each of a plurality of counter electrodes 26, which is grounded and paired with a corresponding one of a plurality of of the control electrodes 24, provides a blanking deflection of a corresponding beam 20. Each of a plurality of pull-down resistors 60 is arranged between a corresponding one of a plurality of counter electrodes 26 and the ground. One of both the terminals of each of a plurality of pull-up resistors 66 is connected to a corresponding one a plurality of control electrodes 24, and the other terminal is applied with a positive potential. Each of a plurality of protective resistors 69 (another example of first resistor) is arranged between a corresponding one of a plurality of control circuits 41 and a control electrode 24 corresponding to each of a plurality of control circuits 41. Each of a plurality of control circuits 43 includes the CMOS inverter circuit 68 (one example of second potential applying mechanism) which alternatively selectively applies two different potentials including a positive potential to a corresponding one of a plurality of counter electrodes 26. When the electric potential of a corresponding one of a plurality of control electrodes 24 is fixed to a ground potential, each of a plurality of control circuits 43 changes the electric potential of a corresponding one of a plurality of grounded counter electrodes 26 from one (ground potential) of the two different potentials to the other one (Vdd).

As described above, according to the sixth embodiment, similarly to the fifth embodiment, even when the defective separate blanking system 21 being always fixed to beam ON exists, it is possible to convert the state of being always fixed to beam ON to the state of being always fixed to beam OFF by applying one of the two different type switchable potentials to the counter electrode 26 of the defective separate blanking system 21 by using the cancellation circuit (control circuit 43). Furthermore, even when an open state occurs between the control circuit 41 and the control electrodes 24, a beam OFF state can be obtained by applying the other one of the two different potentials to the counter electrode 26 by using the cancellation circuit (control circuit 43). Moreover, even if a short (short circuit) occurs between the control electrode 24 and the counter electrode 26, failures of the CMOS inverter circuits in the control circuits 41 and 43 can be avoided by the corresponding protective resistor 69.

Seventh Embodiment

Although, in the fifth and sixth embodiments, there has been described a structure in which two types of different electric potentials, namely a positive potential (Vdd) and a ground potential, are switchably applied to the counter electrode 26, it is not limited thereto. In the seventh embodiment, there will be described a structure in which two types of different electric potentials, namely a negative potential (Vss) and a ground potential, are switchably applied to the counter electrode 26. The configuration of the writing apparatus 100 is the same as that of FIG. 1. The contents of the present embodiment may be the same as those of the first or sixth embodiment except what is described below.

Figure 26:
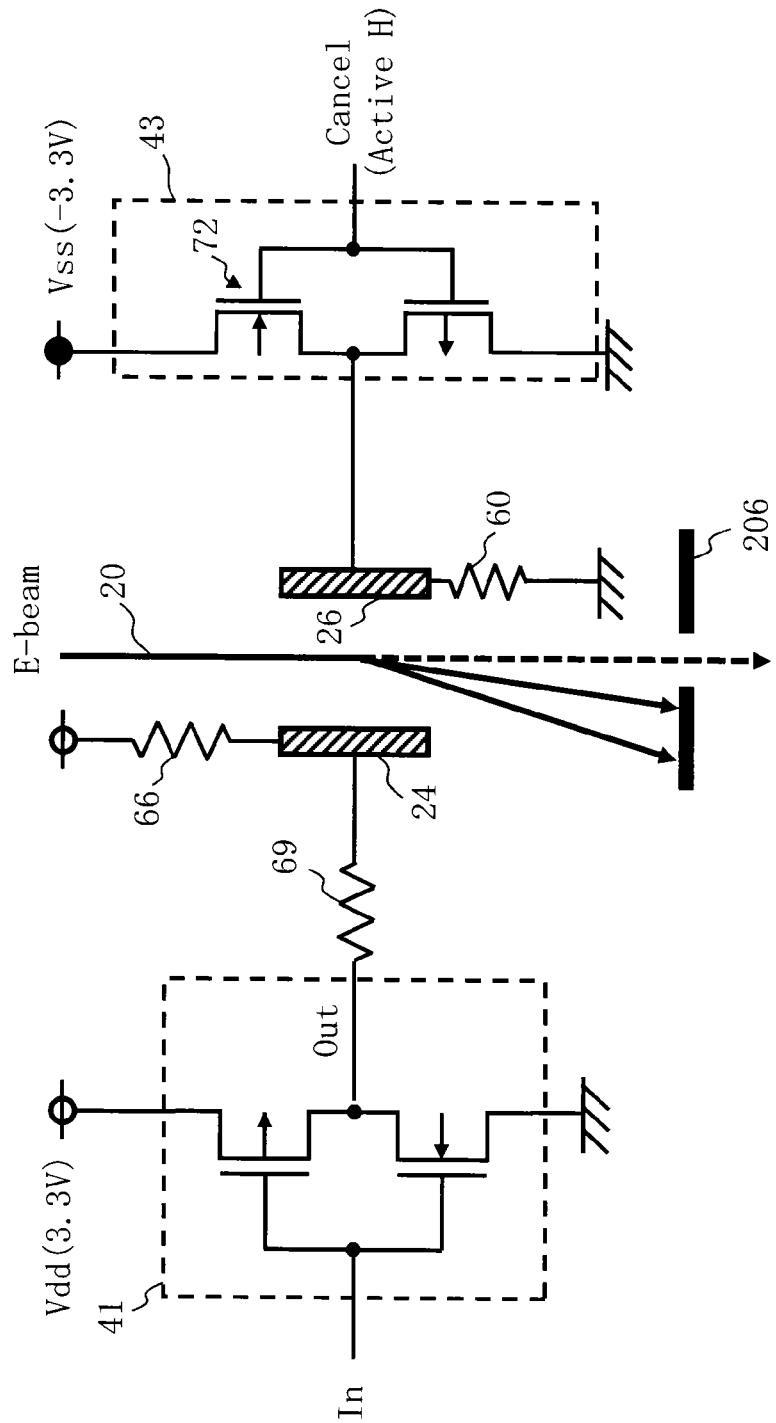
FIG. 26 shows an example of a separate blanking system according to a seventh embodiment.

FIG. 26 shows an example of a separate blanking system according to the seventh embodiment. In FIG. 26, the structure of the control circuit 41 of the separate blanking system 47 is the same as that of FIG. 7 or 8. Similarly to the description of FIG. 8, although only the CMOS inverter circuit is shown in the control circuit 41, it goes without saying that unillustrated circuits for transmitting data or inputting a signal into the CMOS inverter circuit, and like are arranged. The output terminal of the control circuit 41 is connected to one of both the terminals of the protective resistor 69. The other terminal of the protective resistor 69 is connected to the control electrode 24. The control circuit 41, through the protective resistor 69, and one of both the terminals of the pull-up resistor 66 are connected to the control electrode 24, and the other terminal of the pull-up resistor 66 is applied with a positive potential (Vdd) (for example, 3.3V). As the power source having the positive potential (Vdd), the power source having an electric potential applied to the CMOS inverter circuit of the control circuit 41 may be used. However, it is not limited thereto, and another power source having a positive potential may also be prepared. The resistance value of the pull-up resistor 66 is set to a sufficiently high value. For example, the resistance value is preferably greater than or equal to several tens of kΩ, and more preferably greater than or equal to 100 kΩ. Thereby, the electric power consumed by the pull-up resistor 66 can be small or substantially disregarded.

In FIG. 26, the counter electrode 26 is connected to the pull-down resistor 60 and the output terminal of the control circuit 43. The resistance value of the protective resistor 69 is set to a sufficiently low value. When a short circuit occurs between the control electrode 24 and the counter electrode 26, the inverter circuit of the control circuit 41 and the inverter circuit, to be described later, of the control circuit 43 can be protected by the protective resistor 69. In addition, the protective register 69 prevents an electron, scattered by the aperture member 203 on the blanking plate 204 and intruded through the control electrode 24, from damaging the inverter circuit of the control circuit 41. Since the protective resistor 69 is usually inserted in the circuit which has no resistance (in order to reduce a time constant τ=CR due to a stray capacitance C of the circuit), it is desirable to make the resistance value of the protective resistor 69 as low as possible. Considering a voltage division ratio between the protective resistor 69 and the pull-up resistor 66, the resistance value of the protective resistor 69 is preferably lower than or equal to several hundreds of Ω, and more preferably lower than or equal to several tens of Ω, for example.

In the control circuit 43, there is arranged a CMOS (complementary MOS) inverter circuit 72. The CMOS inverter circuit 72 is connected to a ground potential and a negative potential (Vss) (e.g., −3.3V). In addition to the power source having a positive potential applied to the control electrode 24, another power source or circuit (not shown) for generating a negative potential may be arranged. The value of the negative potential (Vss) is not limited to what is obtained by sign-reversing a positive potential (Vdd). Another value may be acceptable as long as by which deflection can be performed in order to let beams OFF.

In the control circuit 43, the output line (OUT) of the CMOS inverter circuit 72 is connected to the counter electrode 26. As the input (IN) of the CMOS inverter circuit 72, either a L (low) electric potential lower than a threshold voltage, or a H (high) electric potential higher than or equal to the threshold voltage is applied serving as a control signal. According to the seventh embodiment, in the state where an L electric potential (e.g., −3.3V=Vss) is applied to the input (IN) of the CMOS inverter circuit, the output (OUT) of the CMOS inverter circuit becomes a ground potential, and the potential of the counter electrode 26 becomes the same potential as the ground because the current does not flow in spite of there being the pull-down resistor 60. Therefore, when the potential of the control electrode 24 is a positive potential (Vdd), it is controlled to be beam OFF by deflecting a corresponding beam 20 by a potential difference and performing blocking using the limiting aperture member 206. When the potential of the control electrode 24 is a ground potential, since there is no potential difference, a corresponding beam 20 is not deflected. Therefore, it is controlled to be beam ON by letting beams pass through the limiting aperture member 206. Accordingly, when in normal use without any problems, an L electric potential is applied to the input (IN) of the CMOS inverter circuit 72.

On the other hand, when the electric potential of the control electrode 24 is always fixed to a ground potential, an H electric potential (active electric potential=ground potential) is applied to the input (IN) of the CMOS inverter circuit 72. Thereby, since the electric potential of the counter electrode 26 substantially becomes a negative potential (Vss), a beam OFF state can be obtained by deflecting a corresponding beam toward the control electrode 24, which is the same direction as that of the usual blanking deflection, to irradiate the limiting aperture member 206 by the beam. In other words, when the electric potential of the control electrode 24 (first electrode) is fixed to a ground potential, the control circuit 43 (electric potential change mechanism) changes the potential of the counter electrode 26 (second electrode), which is grounded, to a negative potential from the ground potential. Thus, the CMOS inverter circuit 72 (another example of second potential applying mechanism) in the control circuit 43 (electric potential change mechanism) alternatively selectively applies two different electric potentials (Vss, and ground potential) including a negative potential to the counter electrode 26 (second electrode).

Furthermore, if a disconnection occurs between the control circuit 41 and the control electrodes 24, it is possible to make the potential of the control electrode 24 a positive potential (Vdd) through the pull-up resistor 66. Here, according to the seventh embodiment, regardless of the electric potential of the input (IN) of the CMOS inverter circuit 72, a beam OFF state can be obtained by deflecting a corresponding beam toward the control electrode 24, which is the same direction as that of the usual blanking deflection, to irradiate the limiting aperture member 206 by the beam. When an L electric potential is applied to the input (IN) of the CMOS inverter circuit 72, the potential of the counter electrode 26 can be made to be a ground potential. Therefore, even using the defective separate blanking system 21 which cannot be controlled by the control circuit 41, a beam OFF state can be obtained by deflecting a corresponding beam toward the control electrode 24, which is the same direction as that of the usual blanking deflection, to irradiate the limiting aperture member 206 by the beam. On the other hand, when an H electric potential is applied to the input (IN) of the CMOS inverter circuit 72, the potential of the counter electrode 26 can be made to be a negative potential. Thereby, even using the defective separate blanking system 21 which cannot be controlled by the control circuit 41, a beam OFF state can be obtained by deflecting a corresponding beam toward the control electrode 24, which is the same direction as that of the usual blanking deflection, by using twice the amount of deflection, for example, to irradiate the limiting aperture member 206 by the beam.

On the other hand, if a disconnection occurs between the control circuit 43 and the counter electrodes 26, it becomes possible to make the potential of the counter electrode 26 a ground potential through the pull-down resistor 60. Therefore, unless failures occur between the control circuit 41 and the control electrode 24, it is also possible to use the blanking plate 204 as it is.

Although FIG. 26 shows a separate blanking system for one beam in the multi-beams, other separate blanking systems for remaining beams have the same configuration. While the control circuit 43 (cancellation circuit) may be arranged for each separate blanking system, it is not limited thereto. As explained referring to FIG. 4, a plurality of counter electrodes 26 on the blanking plate 204 may be grouped into a plurality of groups, and one control circuit 43 may be arranged for each of the groups.

Figure 27:
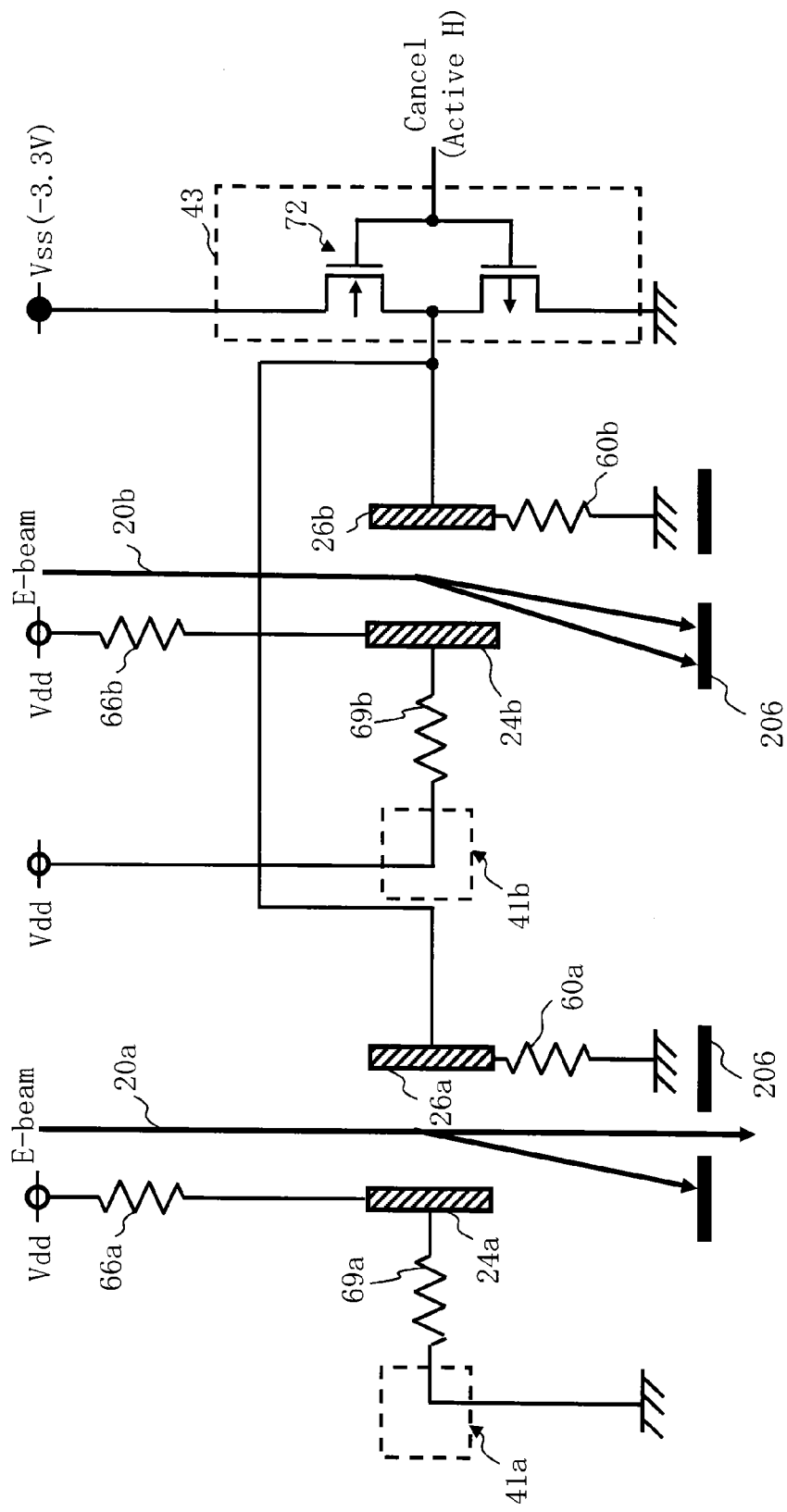
FIG. 27 shows an example of a structure in which one cancellation circuit is arranged for a plurality of separate blanking systems according to the seventh embodiment.

FIG. 27 shows an example of a structure in which one cancellation circuit is arranged for a plurality of separate blanking systems according to the seventh embodiment. As an example, FIG. 27 shows the case in which one control circuit 43 (cancellation circuit) is arranged for two separate blanking systems 47a and 47b. In the separate blanking system 47a, a control circuit 41a, through a protective resistor 69a, and a pull-up resistor 66a are connected to a control electrode 24a, and the pull-up resistor 66a is applied with a positive potential (Vdd). A pull-down resistor 60a, which is grounded, and the control circuit 43 are connected to a counter electrode 26a. Similarly, in the separate blanking system 47b, a control circuit 41b, through a protective resistor 69b, and a pull-up resistor 66b are connected to a control electrode 24b, and the pull-up resistor 66b is applied with a positive potential (Vdd). A pull-down resistor 60b, which is grounded, and the control circuit 43 are connected to a counter electrode 26b. In other words, the control circuit 43 is connected to the counter electrodes 26a and 26b. By applying an H electric potential (active potential) to the input (IN) of the CMOS inverter circuit 72 in the control circuit 43, electric potentials of the counter electrodes 26a and 26b can simultaneously be negative potentials (Vss). Therefore, when both the control electrodes 24a and 24b are always fixed to ground potentials, their beam ON states can be changed into beam OFF states at the same time.

Even when one of the control electrodes 24a and 24b (e.g., control electrode 24a) is always fixed to a ground potential, it is possible to also make a beam OFF state of the other one (e.g., control electrode 24b) by performing a blanking control so that the other one concerned may be beam ON to have a ground potential. Moreover, if the input of the control circuit 43 is an H potential, beam OFF can be obtained whether the electric potential of the normal control electrode 24b is a ground potential or a positive potential. Furthermore, as described above, even when a disconnection occurs in one or both of the control electrodes 24a and 24b, beams to the control electrode 24 which has been disconnected can be made to be beam OFF regardless of the input (IN) of the CMOS inverter circuit 72.

As described above, the blanking plate 204 (blanking device) of the seventh embodiment, similarly to the fifth embodiment, includes a plurality of control electrodes 24 (first electrode), a plurality of control circuits 41 (first potential applying mechanism), a plurality of counter electrodes 26 (second electrode), and a plurality of control circuits 43 (electric potential change mechanism). The blanking plate 204 further includes a plurality of pull-down resistors 60, a plurality of pull-up resistors 66, and a plurality of protective resistors 69. Each of a plurality of control circuits 41 alternatively selectively applies two different electric potentials, for blanking control, for switching a corresponding beam 20 of the multi-beams 20 (multi charged particle beam) between a beam ON state and a beam OFF state, to a corresponding one of a plurality of control electrodes 24. Each of a plurality of counter electrodes 26, which is grounded and paired with a corresponding one of a plurality of of the control electrodes 24, provides a blanking deflection of a corresponding beam 20. Each of a plurality of pull-down resistors 60 is arranged between a corresponding one of a plurality of counter electrodes 26 and the ground. One of both the terminals of each of a plurality of pull-up resistors 66 is connected to a corresponding one a plurality of control electrodes 24, and the other terminal is applied with a positive potential. Each of a plurality of protective resistors 69 (another example of first resistor) is arranged between a corresponding one of a plurality of control circuits 41 and a control electrode 24 corresponding to each of a plurality of control circuits 41. Each of a plurality of control circuits 43 includes the CMOS inverter circuit 72 (another example of second potential applying mechanism, or one example of third potential applying mechanism) which alternatively selectively applies two different potentials including a negative potential to a corresponding one of a plurality of counter electrodes 26. When the electric potential of a corresponding one of a plurality of control electrodes 24 is fixed to a ground potential, each of a plurality of control circuits 43 changes the electric potential of a corresponding one of a plurality of grounded counter electrodes 26 from one (ground potential) of the two different potentials to the other one (Vss).

As described above, according to the seventh embodiment, even when the defective separate blanking system 21 being always fixed to beam ON exists, it is possible to convert the state of being always fixed to beam ON to the state of being always fixed to beam OFF by applying one of the two different type switchable potentials to the counter electrode 26 of the defective separate blanking system 21 by using the cancellation circuit (control circuit 43). Furthermore, when a disconnection occurs between the control circuit 41 and the control electrodes 24, a beam OFF state can be obtained by applying whichever one of the two different potentials to the counter electrode 26 by using the cancellation circuit (control circuit 43). Moreover, even if a short (short circuit) occurs between the control electrode 24 and the counter electrode 26, failures of the CMOS inverter circuits in the control circuit 41 and 43 can be avoided by the corresponding protective resistor 69.

Eighth Embodiment

Although, in the seventh embodiment, there has been described a structure in which two types of different electric potentials including a negative potential are switchably applied to the counter electrode 26, it is not limited thereto. In the eighth embodiment, another example will be described. The configuration of the writing apparatus 100 is the same as that of FIG. 1. The contents of the present embodiment may be the same as those of the first or seventh embodiment except what is described below.

Figure 28:
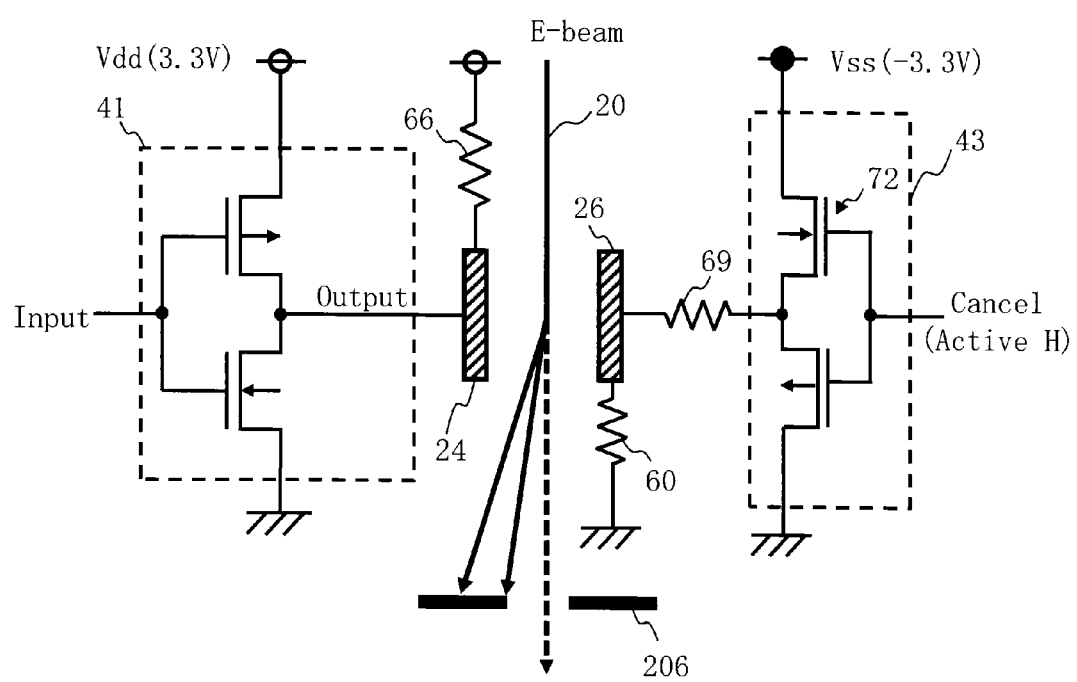
FIG. 28 shows an example of a separate blanking system according to an eighth embodiment.

FIG. 28 shows an example of a separate blanking system according to the eighth embodiment. FIG. 28 is the same as FIG. 26 except that the arrangement position of the protective resistor 69 has been changed to the counter electrode 26 side from the control electrode 24 side. That is, in FIG. 28, the counter electrode 26 is connected to the pull-down resistor 60 and one of both the terminals of the protective resistor 69, and the other terminal of the protective resistor 69 is connected to the output terminal of the control circuit 43. The resistance value of the protective resistor 69 is set to a sufficiently low value. When a short circuit occurs between the control electrode 24 and the counter electrode 26, the inverter circuit of the control circuit 41 and the inverter circuit 72 of the control circuit 43 can be protected by the protective resistor 69. In addition, the protective register 69 prevents an electron, scattered by the aperture member 203 on the blanking plate 204 and intruded through the counter electrode 26, from damaging the inverter circuit 72 of the control circuit 43. Since the protective resistor 69 is usually inserted in the circuit which has no resistance (in order to reduce a time constant τ=CR due to a stray capacitance C of the circuit), it is desirable to make the resistance value of the protective resistor 69 as low as possible. Considering a voltage division ratio between the protective resistor 69 and the pull-down resistor 60, the resistance value of the protective resistor 69 is preferably lower than or equal to several hundreds of Ω, and more preferably lower than or equal to several tens of Ω, for example. On the other hand, the control electrode 24 is connected to the pull-up resistor 66 and the output terminal of the control circuit 41.

Although FIG. 28 shows a separate blanking system for one beam in the multi-beams, other separate blanking systems for remaining beams have the same configuration. While the control circuit 43 (cancellation circuit) may be arranged for each separate blanking system, it is not limited thereto. As shown in FIG. 4, a plurality of counter electrodes 26 on the blanking plate 204 may be grouped into a plurality of groups, and one control circuit 43 may be arranged for each group.

As described above, according to the eighth embodiment, similarly to the seventh embodiment, even when the defective separate blanking system 21 being always fixed to beam ON exists, it is possible to convert the state of being always fixed to beam ON to the state of being always fixed to beam OFF by applying one of the two different type switchable potentials to the counter electrode 26 of the defective separate blanking system 21 by using the cancellation circuit (control circuit 43). Furthermore, when a disconnection occurs between the control circuit 41 and the control electrodes 24, a beam OFF state can be obtained by applying whichever one of the two different potentials to the counter electrode 26 by using the cancellation circuit (control circuit 43). Moreover, even if a short (short circuit) occurs between the control electrode 24 and the counter electrode 26, failures of the CMOS inverter circuits in the control circuits 41 and 43 can be avoided by the corresponding protective resistor 69.

Embodiments have been explained referring to concrete examples described above. However, the present invention is not limited to these specific examples. While the case of inputting a 10-bit control signal for controlling each control circuit 41 has been described above, the number of bits may be suitably set. For example, a 2-bit (or 3 to 9 bit) control signal may be used. Further, a control signal of 11-bit or more may also be used.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other blanking device for multi charged particle beams, multi charged particle beam writing apparatus, and method for blocking defective beams of multi charged particle beams that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking device for multi-beam of charged particles comprising:
    a plurality of separate blanking systems which are arrayed and each of which is configured to provide blanking control that switch a corresponding beam of multi-beam of charged particles between a beam ON state and a beam OFF state, the each of the plurality of separate blanking systems including
        a first electrode,
        a first potential applying control circuit configured to apply two different potentials selectively to the first electrode for the blanking control,
        a second electrode configured to perform blanking deflection of the corresponding beam, the second electrode being grounded and paired with the first electrode, and
        a potential change control circuit configured to change a potential of the second electrode from a ground potential to another potential,
    wherein the first electrode is connected to a ground via the first potential applying control circuit, the second electrode is grounded via a circuit element outside of the potential change control circuit, in a normal blanking control state the first potential applying control circuit is configured to alternately switch application of the ground potential and the another potential to the first electrode, and in an abnormal blanking control state in which a potential of the first electrode included in one of the plurality of separate blanking systems is fixed to the ground potential such that switching application of the two different potentials cannot be applied to the first electrode, the potential change control circuit is configured to change the potential of the second electrode corresponding to the first electrode fixed to the ground potential, from the ground potential to the another potential.

2. The apparatus according to claim 1, wherein
the second electrode of each of the plurality of separate blanking systems is assigned to any one of a plurality of groups, and
the potential change control circuit is arranged for each of the plurality of groups.

3. The apparatus according to claim 1, wherein each of the plurality of separate blanking systems further includes a pull-up resistor whose one end is connected to the first electrode and other end is applied with a positive potential.

4. The apparatus according to claim 1, wherein
each of the plurality of separate blanking systems further includes a first resistor arranged between the first potential applying mechanism and the first electrode corresponding to the first potential applying control circuit, and
the potential change control circuit includes a second potential applying control circuit that selectively applies two different potentials including a positive potential to the second electrode whose potential is to be changed.

5. The apparatus according to claim 1, wherein
each of the plurality of separate blanking systems further includes a first resistor arranged between the potential change mechanism and the second electrode corresponding to the potential change control circuit, and
the potential change control circuit includes a second potential applying control circuit that selectively applies two different potentials to the second electrode whose potential is to be changed.

6. The apparatus according to claim 1, wherein
each of the plurality of separate blanking systems further includes a pull-down resistor arranged between the second electrode and ground, and
the potential change control circuit includes a switch, one end of which is connected to the second electrode whose potential is to be changed and other end is applied with a positive potential.

7. The apparatus according to claim 1, wherein
each of the plurality of separate blanking systems further includes a pull-down resistor arranged between the second electrode and ground, and
the potential change control circuit includes a switch, one end of which is connected to the second electrode whose potential is to be changed and other end is applied with a negative potential.

8. The apparatus according to claim 1, wherein the potential change control circuit includes a second potential applying control circuit that selectively applies two different potentials including a negative potential to the second electrode whose potential is to be changed.

9. A writing apparatus using multi-beam of charged particles comprising:
a stage configured to mount a target object thereon and to be continuously movable;
an emission unit configured to emit a charged particles beam;
an aperture member, in which a plurality of openings are formed, configured to form multi-beams by making a region including a whole of the plurality of openings irradiated by the charged particle beam and letting portions of the charged particle beam respectively pass through a corresponding opening of the plurality of openings;
a blanking device for multi-beam of charged particles according to claim 1 configured to respectively perform blanking deflection for a corresponding beam of the multi-beams having passed through the plurality of openings of the aperture member; and
a blanking aperture member configured to block each beam of the multi-beams which has been deflected to be in an OFF state by the blanking device.

10. A method for blocking defective beams of multi-beam of charged particles comprising:
selectively applying two different potentials, for blanking control in a normal blanking control state, for switching a corresponding beam of multi-beam of charged particles between a beam ON state and a beam OFF state, to a first electrode using a first potential applying control circuit configured to apply the two different potential selectively, wherein the first electrode is connected to a ground via the first potential applying control circuit;
changing a potential of a second electrode, which is grounded and paired with the first electrode to perform blanking deflection in an abnormal blanking control state, of a corresponding beam, to another potential from a ground potential using a potential change control circuit, wherein the second electrode is grounded via a circuit element outside of the potential change control circuit, when a potential of the first electrode is fixed to the ground potential such that switching of the two different potentials cannot be applied to the first electrode; and
blocking the corresponding beam, which has been deflected by the second electrode, by a blanking aperture member.

* * * * *